United States Patent
Sato et al.

(10) Patent No.: US 6,741,434 B1
(45) Date of Patent: May 25, 2004

(54) MAGNETIC SENSOR AND PRODUCTION METHOD THEREOF, FERROMAGNETIC TUNNEL JUNCTION ELEMENT, AND MAGNETIC HEAD

(75) Inventors: Masashige Sato, Kawasaki (JP); Hideyuki Kikuchi, Kawasaki (JP); Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 66 days.

(21) Appl. No.: 09/704,010

(22) Filed: Nov. 1, 2000

Related U.S. Application Data

(63) Continuation of application No. PCT/JP00/00351, filed on Jan. 25, 2000.

(30) Foreign Application Priority Data

Mar. 1, 1999 (JP) ........................................... 11-053020
Mar. 2, 1999 (JP) ........................................... 11-053974

(51) Int. Cl.⁷ ............................................. G11B 5/127
(52) U.S. Cl. .................................................... 360/324.2
(58) Field of Search ...................... 360/324.2; 428/692; 365/171–173

(56) References Cited

U.S. PATENT DOCUMENTS

| | | |
|---|---|---|
| 5,650,958 A | 7/1997 | Gallagher et al. |
| 5,862,022 A * | 1/1999 | Noguchi et al. ......... 360/324.2 |
| 5,968,677 A * | 10/1999 | Wanatabe et al. ........... 428/692 |
| 6,069,820 A * | 5/2000 | Inomata et al. ............. 365/171 |
| 6,299,990 B1 * | 10/2001 | Wanatabe et al. ........... 428/692 |
| 6,331,944 B1 * | 12/2001 | Monsma et al. ............. 365/171 |
| 6,351,410 B1 * | 2/2002 | Nakao et al. ................ 365/171 |
| 6,381,171 B1 * | 4/2002 | Inomata et al. ............. 365/173 |
| 6,504,689 B1 * | 1/2003 | Gill et al. ................. 360/324.2 |
| 6,567,244 B1 * | 5/2003 | Gill ........................... 360/314 |

FOREIGN PATENT DOCUMENTS

| | | |
|---|---|---|
| JP | 80 70148 | 3/1996 |
| JP | 92 69362 | 10/1997 |

* cited by examiner

Primary Examiner—Allen Cao
(74) Attorney, Agent, or Firm—Greer, Burns & Crain, Ltd.

(57) ABSTRACT

A magnetic sensor which comprises (1) a supporting substrate, (2) a ferromagnetic tunnel junction element which has a first magnetic layer on the supporting substrate, a tunnel insulation layer on the first magnetic layer, the tunnel insulation layer comprising aluminum oxide obtained by oxidizing an aluminum film formed on the first magnetic layer by sputtering using an aluminum target having a purity of 99.999% or more, and a second magnetic layer on the tunnel insulation layer, and (3) a converter element converting a change in a magnetic field to a change in resistance. Alternatively, as the ferromagnetic tunnel junction element of (2), one whose tunnel junction has a voltage-resistance characteristic which is asymmetric in the direction of the applied voltage is used. The asymmetric voltage-resistance characteristic may be obtained by heat treatment of a film of the insulation layer material, changing a partial pressure of oxygen in an atmosphere for the formation of insulation layer of an oxide, use of two or more target material for the formation of film and a moving substrate, and the like.

17 Claims, 15 Drawing Sheets

MAGNETIC SENSOR AND PRODUCTION METHOD THEREOF, FERROMAGNETIC TUNNEL JUNCTION ELEMENT, AND MAGNETIC HEAD

CROSS-REFERENCE TO RELATED APPLICATIONS

This application is a continuation of PCT Application No. PCT/JP00/00351, filed on Jan. 25, 2000, and is based upon and claims priorities of Japanese Patent Applications No. 11-53020, filed on Mar. 1, 1999, and No. 11-53974, filed on Mar. 2, 1999, the contents being incorporated herein by reference.

TECHNICAL FIELD

The invention relates to a magnetic sensor and a method of producing the same and, particularly, relates to a magnetic sensor having a ferromagnetic tunnel junction used for a read head for high density magnetic record or a sensor for sensing a magnetic field and a method of producing the same.

BACKGROUND ART

In a junction of a laminate structure in which a metal layer, an insulation layer, and a metal layer are laminated in this sequence (in this description, such a laminate structure is denoted as "metal/insulator/metal"), it is known that in the case where the thickness of the insulation layer is substantially small (of the order of several hundreds picometers to several thousands picometers), a small electric current is passed when a voltage is applied between the metal layers on both sides. This phenomenon is called "tunnel effect", and can be explained quantum-mechanically. Also, the current is called a tunnel current, and such a junction is called a tunnel junction.

As an insulation layer in such a tunnel junction, an oxidized metal film is conventionally used. For instance, a film of aluminum oxide formed by oxidizing a surface layer of aluminum by natural oxidation, plasma oxidation, or thermal oxidation is used as an insulation layer. The aluminum oxide film can have a thickness of the order of several hundreds picometers to several thousands picometers, which is needed for a tunnel effect, by control of the oxidation conditions.

A junction having a structure of ferromagnetic metal/insulator/ferromagnetic metal, which is formed to have metal layers of ferromagnetic material on both sides of a tunnel junction, is called a ferromagnetic tunnel junction. In this case, it is known that a-magnitude of tunnel current depends on the magnetization conditions of both ferromagnetic metal layers. The largest tunnel current is passed when the directions of magnetization of both layers are oriented in the same direction, and a small tunnel current is passed when the directions of magnetization of both layers are opposite to each other. It is explained that conductive electrons are polarized in a ferromagnetic material, and that this phenomena is caused by the electrons tunneling while retaining the polarization. The electron polarizing in one direction can only tunnel to the state in which electrons are polarized in that direction, and the electron polarizing in the opposite direction can, only tunnel to the state in which electrons are polarized in the opposed direction. When ferromagnetic substances of both metal layers sandwiching an insulation layer have the same direction of magnetization, tunneling can occur between the same states, and a tunnel current is large (a tunnel probability is high). When they have opposite directions of magnetization, tunneling cannot occur unless an electron in a state in which the electron polarizes in one direction and an electron in a state in which the electron polarizes in the opposite direction respectively find vacancies in states in the layer to which they are to tunnel and, in general, a tunnel current is small (a tunnel probability is small).

Thus, in the ferromagnetic tunnel junction, a tunnel probability (tunnel resistance) depends on the magnetization states of magnetic layers in both sides and, on this account, the tunnel resistance can be controlled by applying an external magnetic field to change the magnetization states of the magnetic layers.

In other words, a change in external magnetic field can be detected by the change in tunnel resistance.

A tunnel resistance R can be represented by the following equation:

$$R = R_s + (\tfrac{1}{2})\Delta R(1 - \cos \theta) \tag{1}$$

wherein $\theta$ is a relative angle of magnetization between both magnetic layers, $R_s$ is a tunnel resistance when the relative angle $\theta$ is $0°$, i.e. the directions of magnetization of both magnetic layers are parallel, and $\Delta R$ is a difference between a tunnel resistance in the case where the directions of magnetization of both magnetic layers are parallel and a tunnel resistance in the case where the directions of magnetization of both layers are anti-parallel.

As is understood from equation (1), a tunnel resistance is smallest when the directions of magnetization of both magnetic layers are parallel, and is largest when they are anti-parallel. This is caused by that electrons in a ferromagnetic substance being polarized in spin. An electron is commonly in either an upward-spinning state or a downward-spinning state. The electron in the upward-spinning state is called an up-spin electron, and the electron in the downward-spinning state is called a down-spin electron.

In a non-magnetic substance, the numbers of up-spin electrons and down-spin electrons are equal to each other. On this account, a non-magnetic substance does not show magnetic properties, as a whole. On the other hand, in a ferromagnetic substance, the numbers of up-spin electrons and down-spin electrons are different from each other. Accordingly, the ferromagnetic substance has an upward or downward magnetization, as a whole.

It is known that when electrons tunnel in a tunnel junction, respective electrons tunnel retaining their spin state. An electron can tunnel to a magnetic layer if the layer has a vacancy in energy level corresponding to the spin state of the tunneling electron, and cannot tunnel if there is no vacancy in energy level.

A rate of change in tunnel resistance, $\Delta R/Rs$, is represented by the following equation using a product of a polarizability of a magnetic layer of electron source and a polarizability of vacant energy level in a magnetic layer to which electrons are to tunnel:

$$\Delta R/R_s = 2P_1 P_2 / (1 - P_1 P_2) \tag{2}$$

wherein $P_1$ denotes of a spin polarizability of electron of an electron source, and $P_2$ denotes a spin polarizability of vacant energy level in a magnetic layer to which electrons are to tunnel. Further, $P_1$ and $P_2$ are represented as follows:

$$P_1, P_2 = 2(N_{up} - N_{down})/(N_{up} + N_{down}) \tag{3}$$

wherein $N_{up}$ denotes the number of up-spin electrons or the number of levels for up-spin electrons, and $N_{down}$ denotes the number of down-spin electrons or the number of levels for down-spin electrons.

The polarizabilities $P_1$, $P_2$ depend the type of ferromagnetic material, and some materials may show a polarizability close to 50%. In this case, a rate of change in resistance of the order of several tens of percent can be expected, which is larger than a rate of change in resistance obtained by anisotropic magnetoresistance effect (AMR) or giant magnetoresistance effect (GMR). For example, it is theoretically predicted that a rate of change in resistance having a value of the order of 20 to 50% can be obtained when a ferromagnetic metal, such as Co, Fe, and Ni, is used in a magnetic layer, and values close thereto have been obtained experimentally. Thus, since a rate of change in resistance in tunnel effect is larger compared to that in conventional anisotropic magnetoresistance effect or giant magnetoresistance effect, an element using a ferromagnetic tunnel junction is expected to be applied to a magnetic sensor in the next generation of devices.

In a tunnel conjunction element, defects, such as pinholes, tend to be generated when a tunnel insulation film sandwiched between two magnetic layers has a small thickness. If a tunnel insulation film has an increased thickness in order to prevent the generation of pinholes, however, there is a problem of reduced rate of change in magnetic resistance.

On the other hand, when a ferromagnetic tunnel conjunction element is used as a magnetic sensor, in general, a magnetic field is applied while passing a constant current (sense current), and change in value of resistance is detected and is converted to a voltage to be output. The ferromagnetic tunnel effect is known to have dependency on applied voltage, and its rate of change in resistance varies dependent on the applied voltage. In FIG. 1, a representative result of measurements of dependency on applied voltage of the rate of change in resistance in ferromagnetic tunnel effect is shown. As is evident from FIG. 1, although the ferromagnetic tunnel junction element has a larger rate of change in resistance at a small voltage, the rate of change in resistance is reduced to about half when a voltage of about 0.4 V is applied. It is thought that the voltage dependency in the ferromagnetic tunnel effect is caused by magnon (fluctuation of magnetic moment) occurring at the interface between a ferromagnetic substance and an insulator.

Although a larger output is obtained, in general, when a larger voltage is applied to an element, a ferromagnetic tunnel junction element provides, in fact, a small output because of the dependency on applied voltage when a large voltage is applied thereto. To solve this, a method in which bias properties are improved by connecting a plurality of tunnel junctions in series to thereby disperse an applied voltage to the respective elements, is disclosed (JP-A-11-112054). According to this method, however, since the junctions are connected in series, the total resistance value is increased.

As a property proper to the ferromagnetic tunnel junction, a non-linear voltage-current (V-I) characteristic is referred to. In FIG. 2, a representative V-I characteristic of the ferromagnetic tunnel junction is shown. Corresponding to this, a value of electric resistance (tunnel resistance) also greatly varies depending on an voltage, and shows a voltage-resistance (V-R) characteristic as seen in FIG. 3. From this, it is understood that, in a ferromagnetic tunnel junction, a resistance value has a great dependency on voltage. Consequently, there is a possibility that the great dependency of resistance value on voltage becomes a restriction on circuit design.

In view of these problems, it is an object of the invention to provide a magnetic sensor having a small reduction in a rate of change in magnetic resistance even at a large thickness of tunnel insulation film, and a method of producing it.

Also, it is another object of the invention to provide a ferromagnetic tunnel junction element having reduced or restricted dependencies of resistance value and rate of change in resistance on voltage, and a magnetic sensor using it.

DISCLOSURE OF THE INVENTION

According to an aspect of the invention, there is provided a magnetic sensor which comprises:

(1) a supporting substrate, (2) a ferromagnetic tunnel junction element which has a first magnetic layer on the supporting substrate, a tunnel insulation layer on the first magnetic layer, the tunnel insulation layer comprising aluminum oxide obtained by oxidizing an aluminum film formed on the first magnetic layer by a sputtering using an aluminum target having a purity of 99.999% or more, and a second magnetic layer on the tunnel insulation layer, and (3) a converter element converting a change in magnetic field to a change in resistance.

According to another aspect of the invention, there is provided a method of producing a magnetic sensor comprising (1) a supporting substrate, (2) a ferromagnetic tunnel junction element having a first magnetic layer on the supporting substrate, a tunnel insulation layer on the first magnetic layer, and a second magnetic layer on the tunnel insulation layer, and (3) a converter element converting a change in magnetic field to a change in resistance, wherein the ferromagnetic tunnel junction element is fabricated by a process including the steps of: forming the first magnetic layer on the supporting substrate, sputtering an aluminum target having a purity of 99.999% or more to form an aluminum film on the first magnetic layer, oxidizing the aluminum film to convert it into the tunnel insulation layer comprising aluminum oxide, and forming the second magnetic layer on the tunnel insulation layer.

Using an aluminum target having a purity of 99.999% or more for the formation of aluminum film before the oxidation, a tunnel insulation layer obtained by the oxidation of the aluminum film can have a relatively large MR ratio even if the aluminum film formed has a large thickness. The initially formed aluminum film thus having a large thickness can be prevented from the generation of defects such as pinholes in this film, and can enhance the reliability of an insulation layer obtained by the oxidation of the aluminum film, to thereby enhance the reliability of a tunnel junction element comprising the insulation layer and also the reliability of an eventually yielded magnetic sensor.

Preferably, the pressure of an atmosphere before the sputtering of the aluminum target is not greater than $2 \times 10^{-4}$ Pa.

Preferably, the aluminum film on the first magnetic layer is oxidized in oxygen plasma to form a tunnel insulation layer comprising aluminum oxide.

According to a further aspect, there is provided a ferromagnetic tunnel junction element comprising a tunnel junction of laminated structure of ferromagnetic material/insulator/ferromagnetic material, wherein the tunnel junction has a voltage-resistance characteristic which is asymmetric in the direction of applied voltage. In this way, by providing a ferromagnetic tunnel junction, in which both resistance value and magnitude of change in resistance have a dependency on voltage, with modified dependencies of resistance value and magnitude of change in resistance on applied voltage which are different between the positive side and the negative side of the applied voltage, the magnitude of change in resistance as well as the resistance value of the tunnel junction element can be simultaneously reduced.

Preferably, the junction having the above-mentioned characteristic can be produced by the use, in an insulator layer, which is a barrier layer in a tunnel junction, of a material having a composition distribution which is asymmetric in relation to the direction of voltage applied, or the use of different materials in the respective layers in contact with the insulator layer.

In addition, dependency of resistance value of a ferromagnetic tunnel junction element on voltage may be reduced by connecting, in the element, two or more junctions in series in such a manner that their changes in resistance for the increase in voltage are developed in opposite directions.

In this tunnel junction element, by providing a voltage-resistance characteristic (V-R characteristic) which is asymmetric in the direction of voltage applied, the magnitude of change in resistance ($\Delta R$) of the ferromagnetic tunnel junction element is reduced with the application of voltage, while the resistance value (R) is also greatly reduced with the application of voltage, and, accordingly the reduction in rate of change in resistance ($\Delta R/R$) of the element can be made small. In the case of an element in which such junctions are connected in series so as to make the directions of change in resistance for the increase in voltage opposite to each other, the changes in resistance of the respective junction when a voltage is applied cancel each other, and the change in resistance becomes small in the whole element.

In this way, according to the invention, large changes in tunnel resistance value and rate of change in resistance in a ferromagnetic tunnel junction element due to an applied voltage can be avoided.

According to the invention, there is also provided a method of producing a ferromagnetic tunnel junction element comprising a tunnel junction of laminated structure of ferromagnetic material/insulator/ferromagnetic material, the method comprising imparting, to the tunnel junction, voltage-resistance characteristic which is asymmetric in the direction of voltage applied thereto.

According to a still further aspect of the invention, there is provided a magnetic sensor comprising:

(a) a supporting substrate, (b) a ferromagnetic tunnel junction element comprising a tunnel junction of a laminated structure of ferromagnetic material/insulator/ferromagnetic material, the tunnel junction having voltage-resistance characteristic which is asymmetric in the direction of voltage applied, and (c) a converter element converting a change in magnetic field to a change in resistance.

BEST MODE FOR CARRYING OUT THE INVENTION

Figure 4:
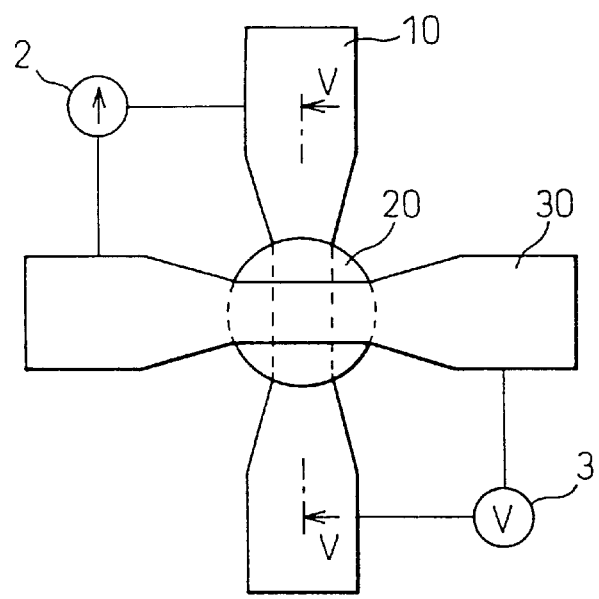
FIG. 4 is a plan view of a magnetic sensor of a first embodiment of the invention.

In FIG. 4, a plan view of a magnetic sensor of an embodiment of the invention is illustrated. In this magnetic sensor, a lower magnetic layer 10 is formed on a silicon substrate (not shown) to extend in the longitudinal direction of the sheet; an intermediate layer 20 is formed generally at the center of the lower magnetic layer 10 to cover it, the layer 20 including a tunnel insulation layer; and an upper magnetic layer 30 extending in the lateral direction of the sheet is formed to cross the lower magnetic layer 10 in the region where the intermediate layer 20 is formed. Each layer is formed by, for example, sputtering using a metal mask having an opening corresponding to the shape of the layer. Between the lower layer 10 and the upper layer 30, a current source 2 and a voltage indicator 3 are connected. A tunnel resistance can be determined by passing a current between the lower magnetic layer 10 and the upper magnetic layer 30 using the current source 2, and measuring a voltage therebetween using the voltage indicator 3.

Figure 5:
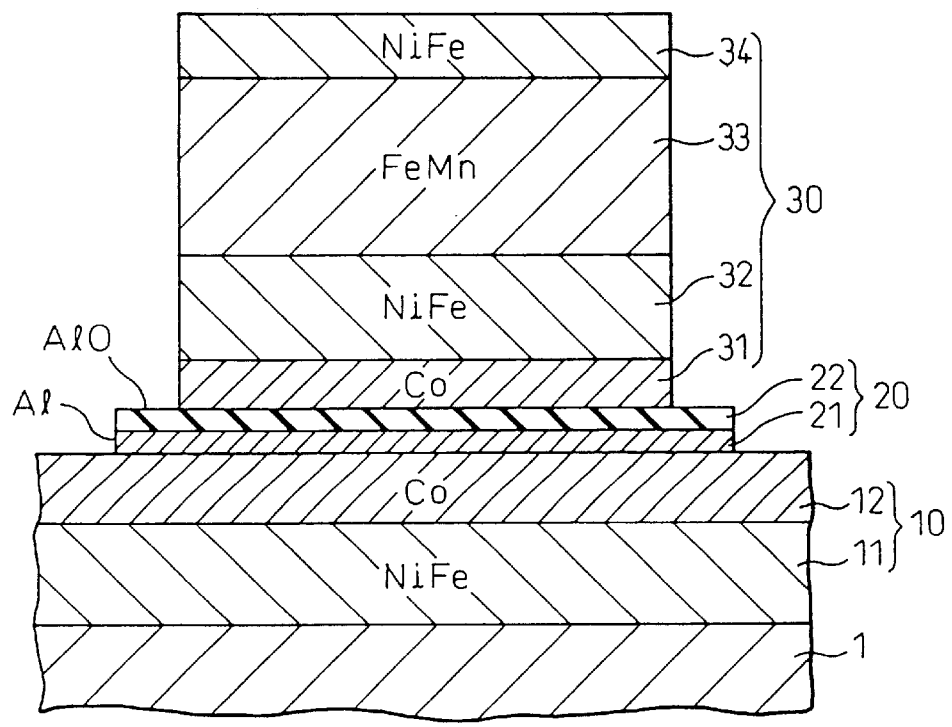
FIG. 5 is a cross section, taken along the line V—V, of the magnetic sensor of FIG. 4.

In FIG. 5, a cross section taken along the line V—V of FIG. 4 is shown. In the embodiment of the drawing, the lower magnetic layer 10, which is formed on a surface of a silicon substrate 1, is made up of a laminate of an NiFe layer 11 and a Co layer 12. In this description, when a composition ratio of a compound is not specified as above, the compound is not limited to have one composition ratio. For instance, NiFe in this embodiment does not mean being limited to one having a composition ratio of 1:1.

The formation of each of the NiFe layer 11 and Co layer 12 is carried out by depositing a material in a magnetic field, the direction of which is parallel to the surface of the substrate 1 and parallel to the extending direction of the lower magnetic layer 10, by a sputtering process. The NiFe layer 11 and the Co layer 12 respectively have thicknesses of 17.1 nanometers and 3.3 nanometers, for instance.

On the lower magnetic layer 10, the intermediate layer 20 exists. In the embodiment of the drawing, the intermediate layer 20 comprises a tunnel insulation layer 22 of AlO, which is formed by depositing an aluminum film having a thickness of, for instance, 1.3 to 3.5 nanometers on the Co layer 12 at the surface of the substrate 1, and then oxidizing it in oxygen plasma, and, if the oxidation is insufficient, an Al layer 21 may also be left under the AlO layer 22.

Preferably, the formation of the Al film for the formation of the intermediate layer 20 is carried out by sputtering. A material for target used in the sputtering is aluminum having a purity of 99.999% (5N) or more. It is preferred to evacuate a sputtering chamber to a pressure of $2 \times 10^{-4}$ Pa or less prior to the sputtering. The oxidation of the deposited Al film is performed preferably using oxygen plasma, for about 40 seconds.

The upper magnetic layer 30 formed on the intermediate layer 20 is made up of a laminate of a 3.3 nanometer thick Co layer 31, a 17.1 nanometer thick NiFe layer 32, a 45 nanometer thick FeMn layer 33, and a 10 nanometer thick NiFe layer 34. Preferably, the respective layers of the upper magnetic layer 30 are formed by sputtering. The sputtering is carried out in a magnetic field, the direction of which is parallel to the face of the substrate 1 and vertically crosses the extending direction of the lower magnetic layer 10. Consequently, the respective layers of the upper magnetic layer 30 are magnetized in the direction vertical to the face of the sheet of FIG. 5.

In general, the polarizability of Co is larger than the polarizability of NiFe. On this account, the rate of change in tunnel resistance $\Delta R/R_s$ represented by equation (2) can be increased by respectively inserting the Co layer 12 and the Co layer 31 between the NiFe layer 11 of the lower magnetic layer 10 and the intermediate layer 20, and the NiFe layer 32 of the upper magnetic layer 30 and the intermediate layer 20.

NiFe is a ferromagnetic substance, and FeMn is an anti-ferromagnetic substance. On this account, in the upper magnetic layer 30, the FeMn layer 33 and the NiFe layer 32 are magnetically exchange-interacted with each other, and the direction of magnetization of the NiFe layer 32, which is a ferromagnetic substance, is fixed regardless of the direction of external magnetic field. Likewise, the direction of magnetization of the Co layer 31 of the upper magnetic layer 30 is also fixed. The NiFe layer 34 on the FeMn layer 33 in the upper magnetic layer 30 prevents the oxidation of the FeMn layer 33.

In contrast to the directions of magnetization of the NiFe layer 32 and the Co layer 31 in the upper magnetic layer 30 which are fixed regardless of the direction of external magnetic field, the directions of magnetization of the NiFe layer 11 and the Co layer 12 of the lower magnetic layer 10 change under the effects of external magnetic field. Accordingly, externally applying a magnetic field to a junction made up of the lower magnetic layer 10, the intermediate layer 20, and the upper magnetic layer 30 shown in FIG. 5, results in the change in relative angle of magnetization between the Co layer 12 of the lower magnetic layer 10 and the Co layer 31 of the upper magnetic layer. This change in relative angle of magnetization between both layers leads to the change in tunnel resistance R, as indicated in equation (1). By measuring this change in tunnel resistance R using the voltage indicator 3, the change in an external magnetic field can be detected.

Figure 6:
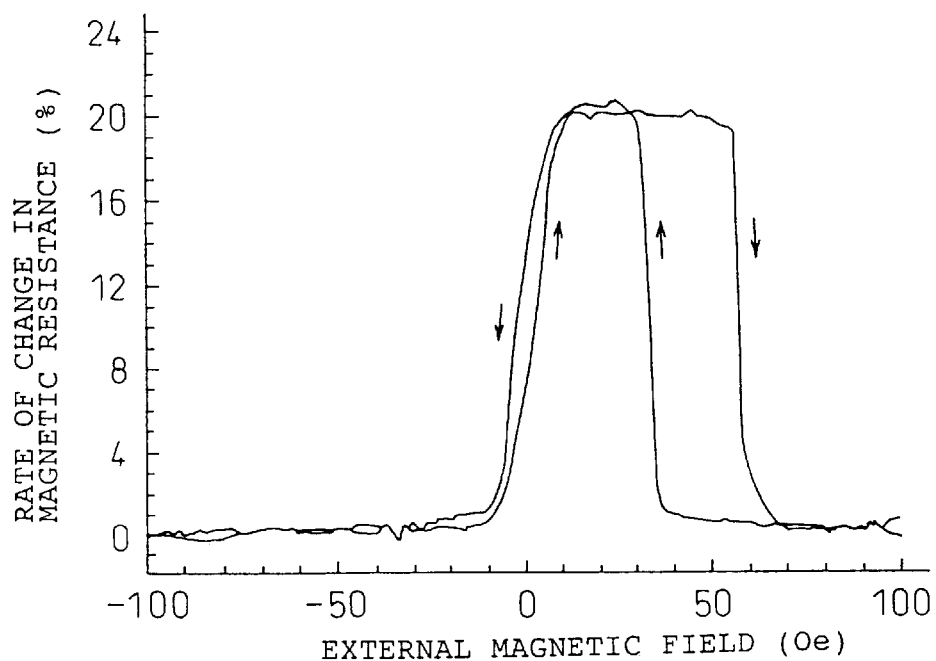
FIG. 6 is a graph showing dependency of rate of change in resistance of a magnetic sensor, as illustrated in FIGS. 4 and 5, on the external magnetic field.

FIG. 6 shows dependency on a magnetic field of a rate of change in tunnel resistance of the magnetic sensor illustrated in FIGS. 4 and 5. The abscissa represents the external magnetic field in the Oe (oersted) units, and the ordinate represents the rate of change in tunnel resistance in %. An oersted, the unit of magnetic field strength, corresponds to $1000/4 = \pi$ amperes per meter. The plus sign of an external magnetic field shows that the direction of the external magnetic field is opposite to the direction of magnetization of the upper magnetic field 30.

When a magnetic field is applied in the direction perpendicular to the face of sheet of FIG. 5 to turn the directions of magnetization of the NiFe layer 11 and the Co layer 12 of the lower magnetic layer 10, so that they are parallel or anti-parallel to the direction of magnetization of the Co layer 31 of the upper magnetic layer 30, the tunnel resistance has a minimum value $\rho_{min}$ when both are parallel to each other, and has a maximum value $\rho_{max}$ when both are anti-parallel. Using the maximum value $\rho_{max}$ and the minimum value $\rho_{min}$ of tunnel resistance, the MR ratio of a tunnel junction element is defined by the following equation:

$$\text{MR ratio } (\%) = ((\rho_{max} - \rho_{min})/\rho_{min}) \times 100 \qquad (4)$$

Two curves appear in FIG. 6 because the MR ratio changes in different manners when the magnetic field is changed from −100 Oe (−7960 A/m) to +100 Oe (+7960 A/m) and when the magnetic field is changed from +100 Oe (+7960 A/m) to −100 Oe (−7960 A/m). When the external magnetic field is not greater than −10 Oe (−796 A/m), the tunnel resistance is equal to $\rho_{min}$ and the rate of change in magnetic resistance is nearly 0%, because the directions of magnetization of the Co layer 31 of the upper magnetic layer 30 and the Co layer 12 of the lower magnetic layer 10 are parallel to each other. When the magnetic field is increased to −10 Oe (−796 A/m) or more, the direction of magnetization of the Co layer 12 of the lower magnetic layer 10 begins to change, and the rate of change in magnetic resistance is increased. When the external magnetic field reaches +15 Oe (+1190 A/m), the directions of magnetization of the upper and lower Co layers 31, 12 are anti-parallel, and the tunnel resistance becomes maximum. The rate of change in magnetic resistance is then about 20%. That is to say, the MR ratio is about 20%.

When the external magnetic field exceeds +60 Oe (+4780 A/m), the direction of magnetization of the Co layer 31 of the upper magnetic layer 30 becomes the same as the direction of the external magnetic field, so that the directions of magnetization of the upper and lower Co layers 31, 12 are parallel to each other. On this account, the tunnel resistance has nearly a minimum value, and the rate of change in magnetic resistance is nearly 0%.

In the case where the external magnetic field is gradually reduced from +100 Oe (+7960 A/m), when the external magnetic field becomes about +35 Oe (+2790 A/m) or less, the direction of magnetization in the Co layer 31 of the upper magnetic layer 30 is the same as the initial direction of magnetization of the FeMn layer 33, and the tunnel resistance has a maximum value. When the external magnetic field reaches about −10 Oe (−796 A/m), the direction of magnetization in the upper and lower Co layers 31, 12 are the same, and the tunnel resistance becomes minimum.

Thus, the magnetic sensor of the invention can be designed in such a manner that the direction of magnetization in one magnetic layer of the two magnetic layers (the first and second magnetic layers) is freely changed by an external magnetic field, and the direction of magnetization in the other magnetic layer is fixed without being affected by an external magnetic field when the external magnetic field is smaller than a certain value.

Figure 7:
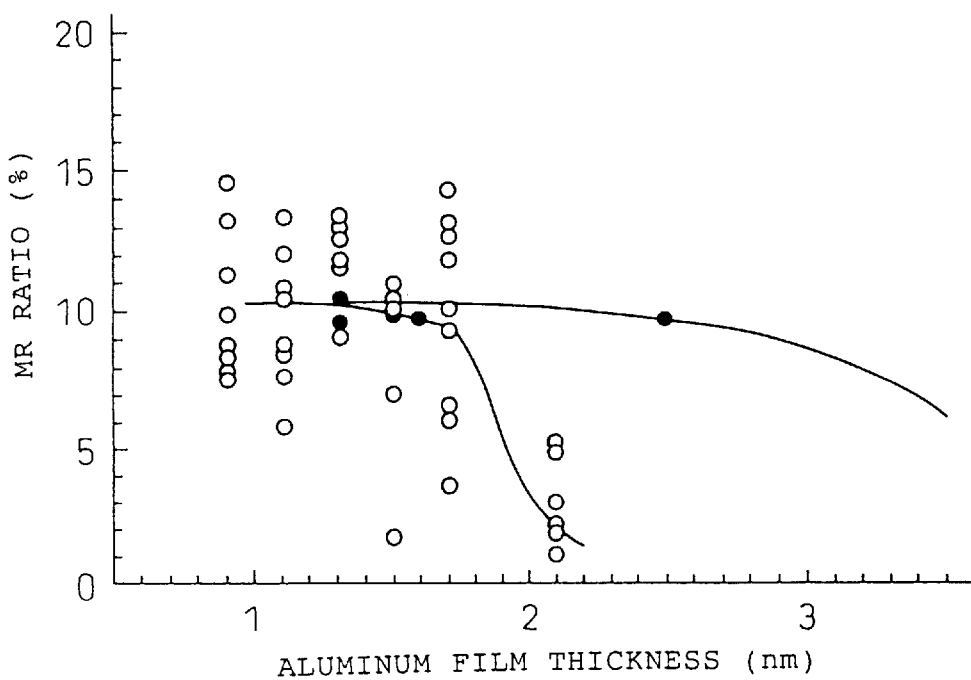
FIG. 7 is a graph showing the relation between the thickness of Al film to form a tunnel insulation layer and the MR ratio of a magnetic sensor.

FIG. 7 shows the dependency, on Al film thickness of the MR ratio of the magnetic sensor made as described above. The abscissa represents the thickness of Al film before oxidization in nanometers, and the ordinate represents the MR ration in percent. The black circles denote MR ratios of a magnetic sensor in the case of the Al film deposited using aluminum target having a purity of 99.999% (5N) or more according to the invention. For comparison, MR ratios of a magnetic sensor in the case where a target having a purity of 99.99% (4N) is used for the formation of Al film are denoted by circles. In the latter case, the MR ratio is reduced in the region of the Al film with a thickness of 1.7 nanometers or more. In contrast, in the case according to the invention, the MR ratio is kept relatively high even when the Al film thickness is 1.7 nanometers or more. Also in the case of the magnetic sensor according to the invention, it is understood that dispersion in the MR ratios is smaller compared to the case shown for comparison.

Thus, by making the purity of Al target material used for the formation of an Al film, to produce an intermediate insulation layer (i.e., tunnel insulation layer) of a ferromagnetic tunnel junction, of 99.999% or more, a relatively large MR ratio can be obtained even at a large thickness of Al film.

Good effects can be expected particularly when the Al film has a thickness of 1.7 nanometers or more, more specifically of the order of 1.7 to 3.5 nanometers. In this case, a total thickness of Al and AlO films after oxidation of an Al film is estimated to be about 8 nanometers.

Figure 8:
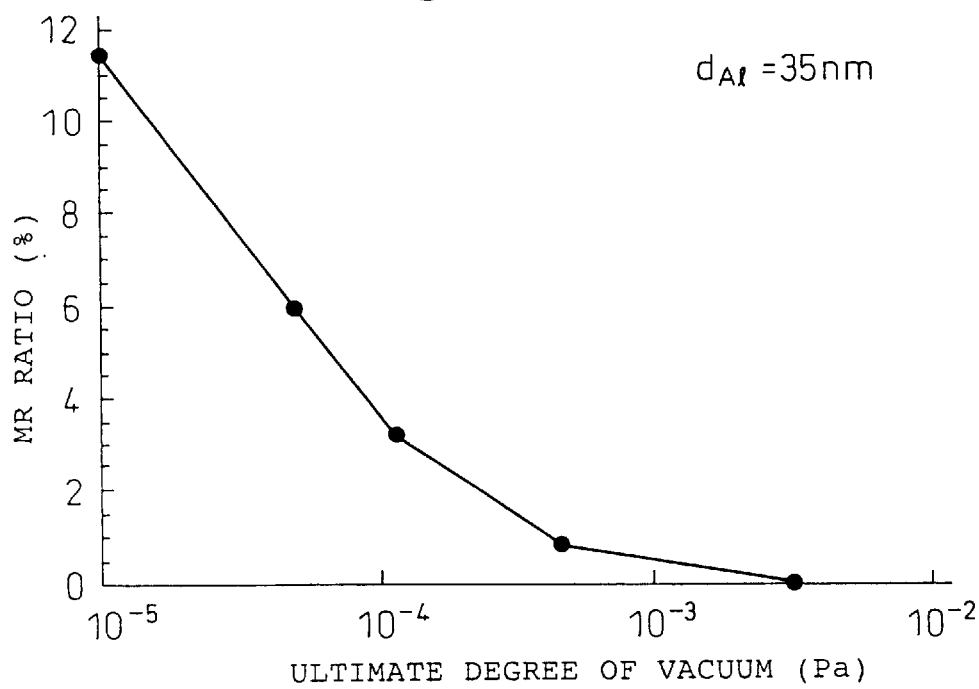
FIG. 8 is a graph showing the relation between the ultimate degree of vacuum in a sputtering chamber before the formation of Al film by sputtering and the MR ratio of a magnetic sensor.

FIG. 8 shows a profile of the change of MR ratio when the ultimate degree of vacuum in a sputtering chamber before sputtering for the formation of Al film is changed. The Al film in this case had a thickness of 3.5 nanometers. It is understood that the MR ratio is reduced when the ultimate degree of vacuum is lowered (the pressure is increased). It is thought that this is because the quality of the tunnel insulation film is degraded under the influence of water remaining in the chamber. To obtain a large MR ratio, it is preferred that the ultimate pressure is not greater than $2 \times 10^{-4}$ Pa.

Thus, by the use of an Al target material having a high purity of 99.999% or more, and by the use of pressure of atmosphere of not greater than $2 \times 10^{-4}$ Pa before film formation when an Al film is formed for the formation of tunnel insulation layer of a ferromagnetic tunnel junction, an MR ratio can be kept relatively high even at a large thickness of the tunnel insulation layer. By a tunnel insulation layer having a large thickness, the generation of defects such as pinholes can be effectively prevented.

Figure 9A:
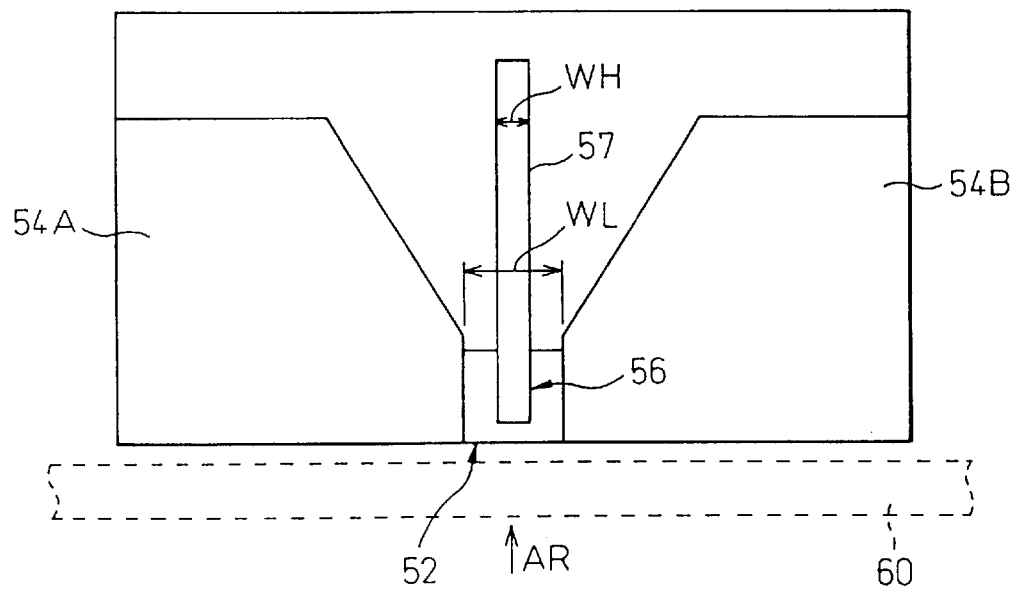
FIG. 9A is a plan view of a magnetic head for a hard disc device using a magnetic sensor according to the invention.
Figure 9B:
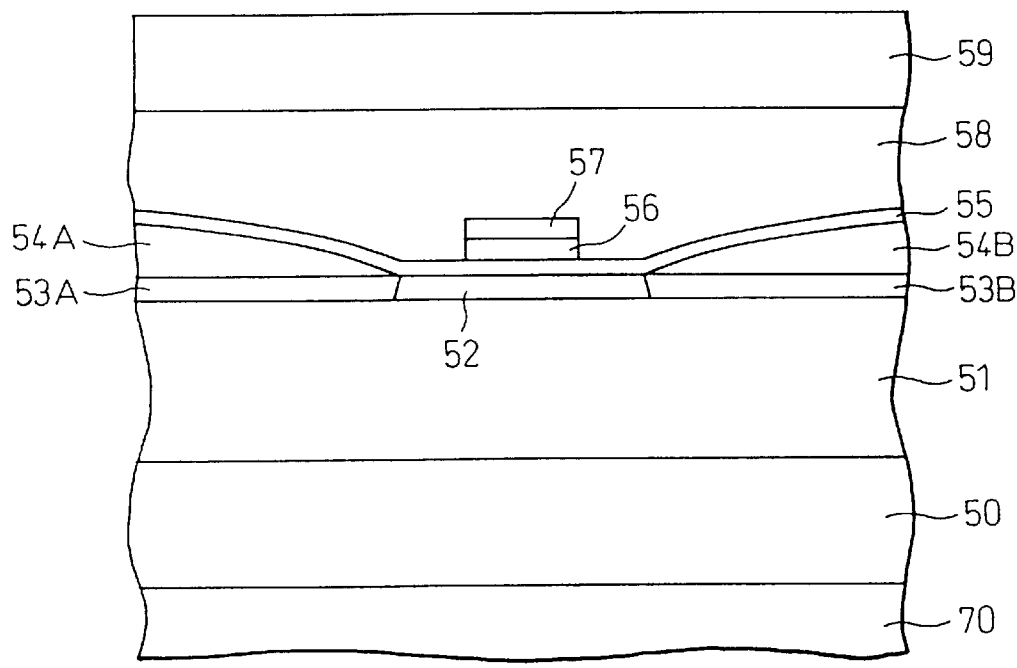
FIG. 9B is a view of the magnetic head of FIG. 9A, which is seen from the direction of the arrow AR in the drawing and is enlarged.

FIG. 9A is a top view of a magnetic head for a hard disc device using a magnetic sensor according to the invention, and FIG. 9B is a front view of the magnetic head of FIG. 9A which is enlarged and viewed from the direction of the arrow AR in the drawing (a view showing the face opposite to a magnetic disc of magnetic recording medium). Referring to FIGS, 9A and 9B, the structure and operation of the magnetic head is described hereinafter.

In the magnetic head shown in these drawings, a lower shield layer 50 consisting of NiFe, FeN or the like is formed on a supporting substrate 70. The supporting substrate 70 is made by forming an alumina ($Al_2O_3$) layer on an $Al_2O_3$—TiC substrate. On the lower shield layer 50, a lower gap layer 51 consisting of $Al_2O_3$ is formed. On the area of part of the lower gap layer 51, a lower magnetic layer 52 is formed. The lower magnetic layer 52 has a width WL of 0.8 micrometer, for instance. CoCrPt layers 53A and 53B are respectively formed on both sides of the lower magnetic layer 52 so as to be in contact with the edge face thereof. The CoCrPt layers 53A and 53B are in electrical contact with the lower magnetic layer 52. The CoCrPt layers 53A and 53B are also magnetized, and provide the lower magnetic layer 52 with a single magnetic domain to restrain a sudden change of the magnetic wall and to eliminate instability in operation.

On the CoCrPt layers 53A and 53B, electrodes 54A and 54B consisting of Ta, Ti, Cu, W or the like are respectively formed. The electrodes 54A and 54B are respectively in electrical-contact with the CoCrPt layers 53A and 53B.

An intermediate layer (tunnel insulation layer) 55 is formed so as to cover the lower magnetic layer 52, and the electrodes 54A and 54B. An upper magnetic layer 56 is formed on part of the area corresponding to the lower magnetic layer 52, of the top surface of the intermediate layer 55, and an upper electrode 57 consisting of Ta, Ti, Cu, W or the like is also formed on it. The upper magnetic layer 56 has a width WH of 0.5 micrometer, for instance. An upper gap layer 58 consisting of $Al_2O_3$ is formed so as to cover the upper electrode 57 and the tunnel insulation layer 55, and an upper shield layer 59 consisting of NiFe or the like is further formed on it. In this way, a ferromagnetic tunnel junction element is constructed by the lower magnetic layer 52, the intermediate layer (tunnel insulation layer) 55, and the upper magnetic layer 56, and, by connecting to it a converter element converting change in magnetic field to change in resistance, the magnetic sensor of the above-mentioned embodiment according to the invention is formed. The converter element converting change in magnetic field to change in resistance herein includes a current source and a voltage indicator previously described referring to FIG. 4, although these are not shown in FIGS. 9A and 9B.

As shown in FIG. 9A, a magnetic disc 60 is opposite to the face which is illustrated in FIG. 9B. As earlier described, the face of the magnetic head opposite to the magnetic recording medium (i.e., the face shown in FIG. 9B) includes the supporting substrate for the magnetic sensor, and the ferromagnetic tunnel junction element having the first magnetic layer, the tunnel insulation layer, and the second magnetic layer, which are successively formed on the supporting substrate. The magnetic disc 60 moves in a direction normal to the upper or lower face of the lower magnetic layer 52 in FIG. 9B (the vertical direction in FIG. 9B) while maintaining a distance from the face shown in FIG. 9B. Depending on a magnetization state of the magnetic disc 60, the direction and magnitude of the magnetic field generated in the lower magnetic layer 52 are changed. When magnetized information on the magnetic disc 60 is read, a constant current is passed between the lower electrode 54A at the left side and the upper electrode 57, and a voltage between both electrodes is detected. Alternatively, a constant current may be passed between the lower electrode 54B at the right side and the upper electrode 57, and a voltage between the lower electrode 54A at the left side and the upper electrode 57 may be detected, and vice versa.

In the above example, although the case where Co and FeNi are used as the ferromagnetic material, and FeMn is used as the anti-ferromagnetic material, is described, other materials may be used. Also, although the magnetic sensor of the invention is applied to a magnetic head for a magnetic disc in the example illustrated in FIGS. 9A and 9B, it is possible that the magnetic sensor according to this example is applied to other devices. For instance, it can be used as a magnetic sensor for a rotary encoder.

The formation of each of the layers in the magnetic sensor can preferably carried out not only by the sputtering process referred to in the previous description but also by a physical vapor deposition (PVD) process by which a film free of defects such as pinholes is, in general, easily made even at a relatively small thickness. For instance, it is possible to use a technique such as evaporation.

A ferromagnetic tunnel junction element according to another embodiment of the invention, a tunnel junction of which has voltage-resistance characteristic symmetric in the direction of voltage applied, will be described. The ferromagnetic tunnel junction element of this embodiment comprises a laminated structure of ferromagnetic material/insulator/ferromagnetic material. Although any ferromagnetic material may be used as long as it displays ferromagnetic properties, a metal, such as nickel (Ni), iron (Fe), or cobalt (Co), or an alloy of these metals is used, in general. As the insulator, any non-magnetic material possessing electrically insulating properties is usable and, by way of example, an insulation material such as alumina ($Al_2O_3$) is referred to. Furthermore, the ferromagnetic tunnel junction element of the invention can comprise a further layer of material, in addition to the laminated layers of ferromagnetic material/insulator/ferromagnetic material constituting a tunnel junction.

In the ferromagnetic tunnel junction element of this embodiment of the invention, it is essential that the section of the tunnel junction has voltage-resistance characteristic which is asymmetric relative to the direction of voltage applied. As a first example of the ferromagnetic tunnel junction element of this embodiment, a ferromagnetic tunnel junction element comprising a junction structure of Co/oxidized Al/Co is described hereinafter.

Figure 10:
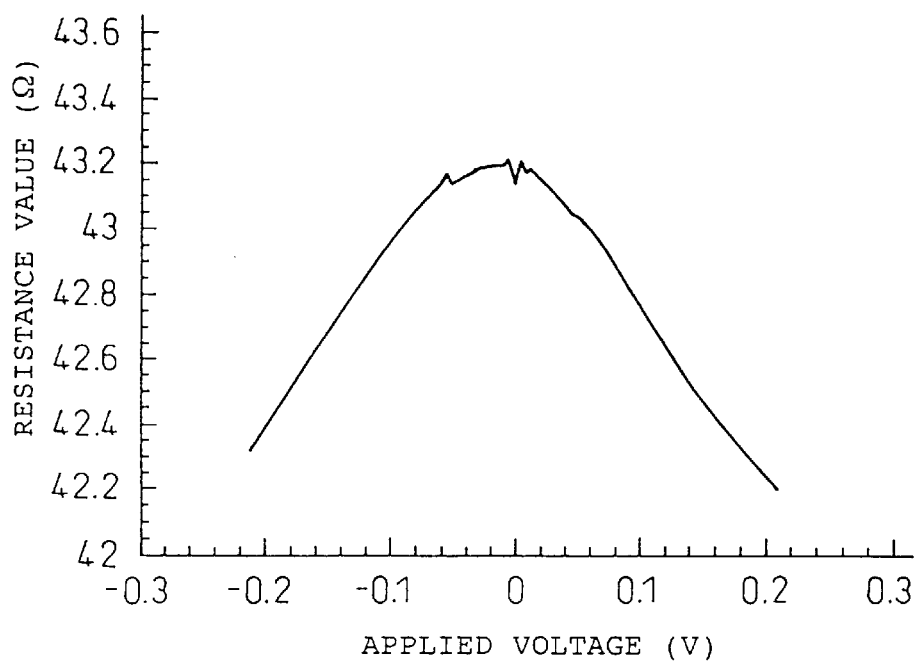
FIG. 10 is a graph showing the voltage-resistance (V-R) characteristic prior to a heat treatment of a ferromagnetic tunnel junction element of a second embodiment of the invention.

Successive films of NiFe (50 nm)/Co (3.3 nm)/Al (1.3 nm) were made on a silicon substrate by a sputtering process, and the surface of the Al was oxidized by oxygen plasma. The NiFe indicates herein an alloy of nickel and iron (permalloy). The figures in the parentheses following each film material denotes a thickness of the film, and the same notation is used in the following description. Subsequently, films of Co (3.3 nm)/NiFe (20 nm)/FeMn (45 nm)/NiFe (20 nm) were further formed sequentially to make a tunnel junction element comprising a tunnel junction of a Co/oxidized Al/Co structure. This tunnel junction element showed a rate of change in resistance (MR) of at most about 16%. The tunnel junction element had V-R characteristic as shown in FIG. 10, the characteristic being nearly symmetric and centered on an applied voltage of 0 V as in conventional elements.

Figure 11:
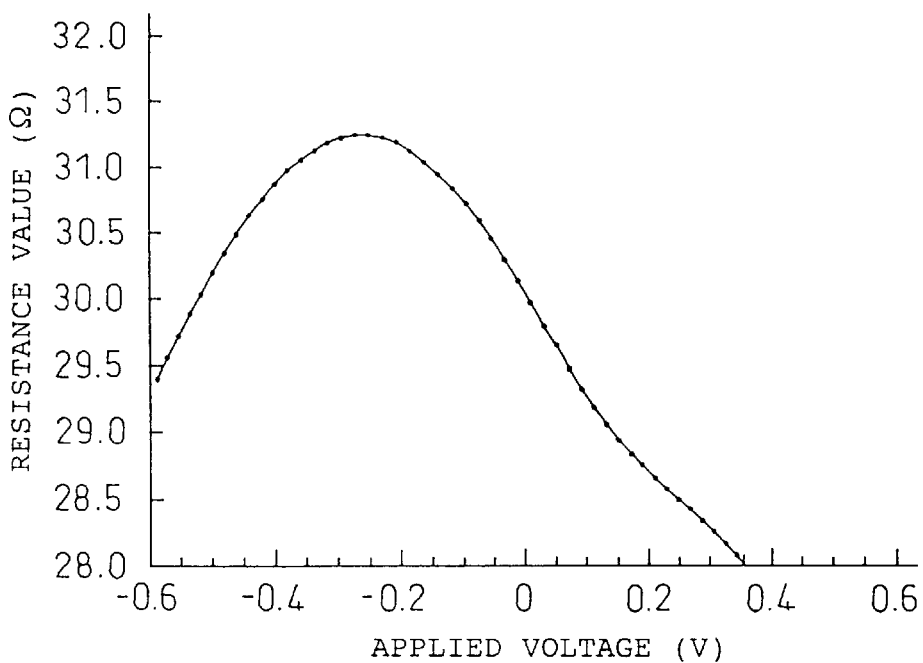
FIG. 11 is a graph showing the voltage-resistance (V-R) characteristic after the heat treatment of the ferromagnetic tunnel junction element of the second embodiment of the invention.

When the junction element was then subjected to a heat treatment at 250° C. for one hour, the rate of change in resistance remained at 16%. The junction element had, however, V-R characteristic after the heat treatment, which is highly asymmetric relative to the line of applied voltage of 0 V, as shown in FIG. 11. The amount of this shift is about 300 to 400 mV.

The tunnel junction element after the heat treatment thus has characteristic of resistance value monotonously decreasing relative to an applied voltage in the vicinity of applied voltage of 0 V, since the point of maximum resistance value shifts in the V-R curve. The characteristic depend on conditions of the insulation layer, which is a barrier layer, and the interface between the insulation layer and the layer of the ferromagnetic material.

Figure 12:
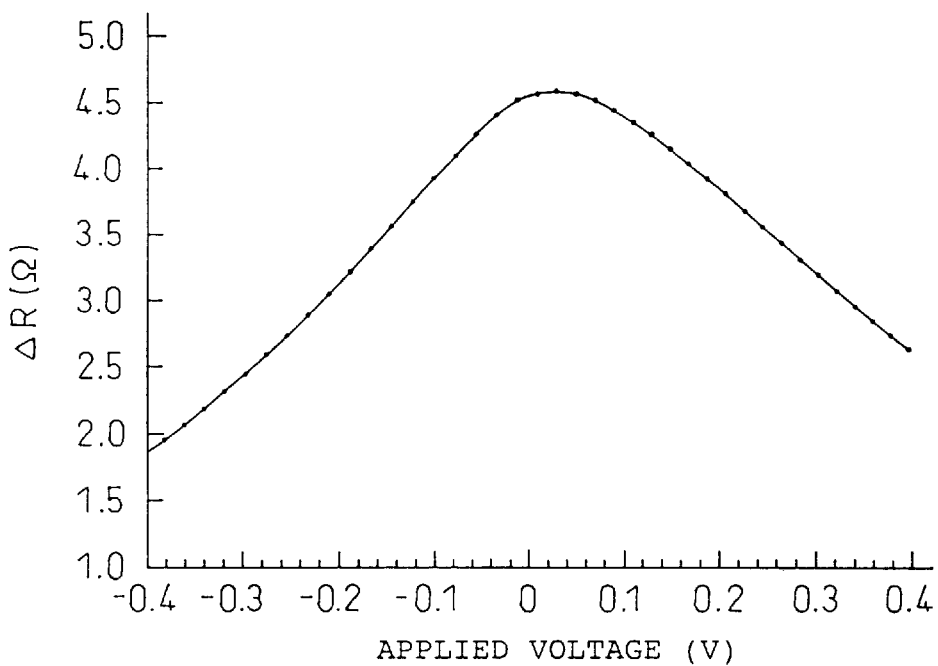
FIG. 12 is a graph showing the change due to voltage in a resistance (V-$\Delta R$) characteristic after the heat treatment of the ferromagnetic tunnel junction element of the second embodiment of the invention.

On the other hand, a V-ΔR curve of the tunnel junction element after the heat treatment is shown in FIG. 12. This curve is unchanged from a curve of conventional element, and is nearly symmetric and centered on the line of applied voltage of 0 V. The element thus has a most large change in resistance in the vicinity of applied voltage of 0 V. It is thought that this is because the decrease in change of resistance is caused by magnon excitation at the interface rather than properties of the barrier layer.

Figure 13:
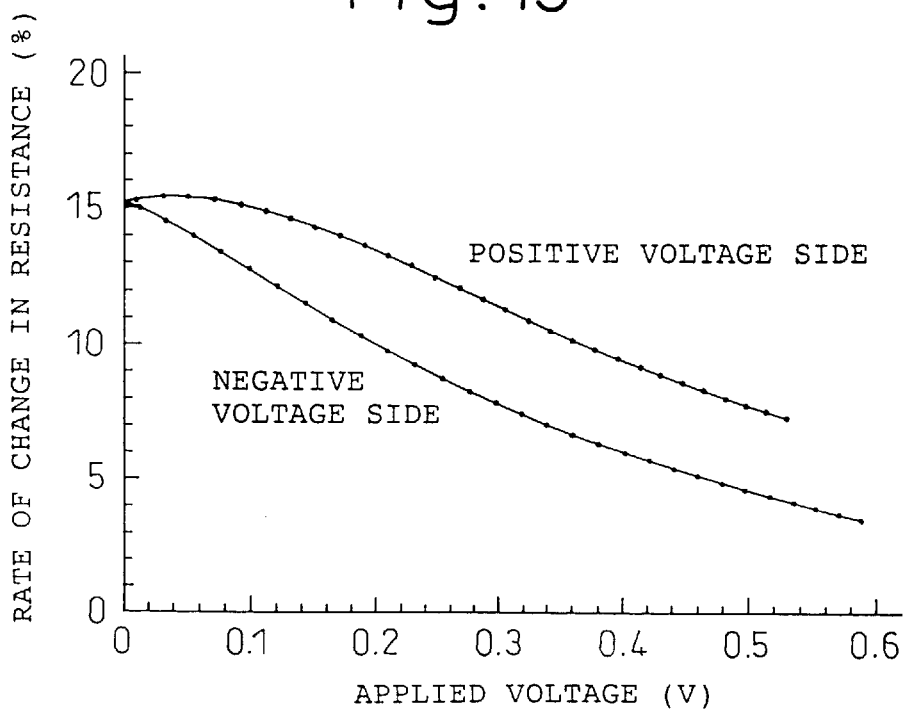
FIG. 13 is a graph showing the rate of change due to voltage in resistance (V-MR) characteristic after the heat treatment of the ferromagnetic tunnel junction element of the second embodiment of the invention.

A V-MR characteristic of the tunnel junction element after the heat treatment is shown in FIG. 13 (the abscissa of the graph of this drawing represents an absolute value of applied voltage). It is understood that because of the non-symmetry of the V-R characteristic of FIG. 11, modes of decrease, on the positive and negative voltage sides, in the rate of change in resistance relative to voltage applied are different from each other, with the decrease in the rate of change being restrained on the positive voltage side, i.e., the V-MR characteristic shifting.

It is considered that the mechanism of the shift in V-MR characteristic in this example is as follows.

Figure 14A:
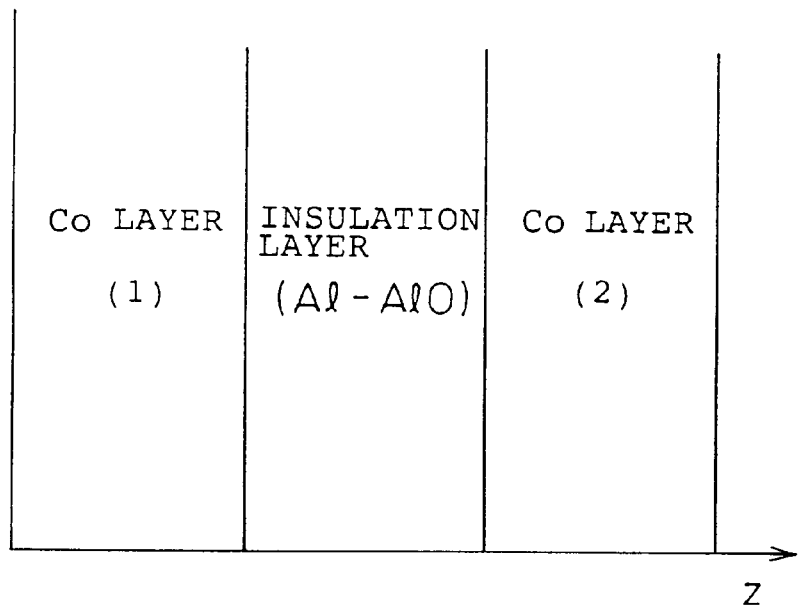
FIGS. 14A and 14B are schematic diagrams illustrating tunnel insulation layers in the ferromagnetic tunnel junction element of the second embodiment of the invention, before and after the heat treatment, respectively.
Figure 14B:
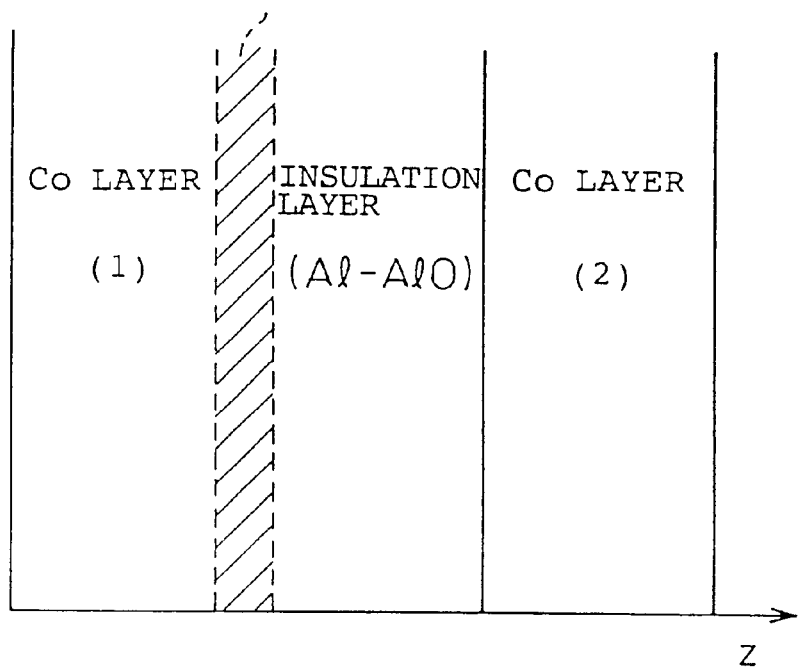

It is considered that immediately after the formation of Al film, the Al is oxidized from its surface in order to form oxidized Al of insulator so that the upper portion of the insulation layer is converted to the oxide, whereas the degree of oxidation of the lower portion thereof is small, and the Al remains as it is. When the insulation layer in this condition, which is schematically shown in FIG. 14A and denoted as Al—AlO in the drawing, is heat-treated, the surface of the insulation layer is hardly susceptible to the heat treatment because of stable $Al_2O_3$ formed thereat. In the lower portion of the insulation layer, however, it is considered that part of the remaining Al and part of Co in the underlying Co layer (1) are diffused by the heat treatment to form a solid solution, and this leads to the formation of Co—Al layer at the boundary region between both layers, in which both exist in combination as schematically shown in FIG. 14B. Consequently, it is considered that the layers having compositions different from each other (the Co—Al layer and the Co layer (2)) exist on either side of the insulation layer of aluminum oxide, which is a tunnel barrier layer, and provide accordingly asymmetric V-R characteristic.

In FIGS. 14A and 14B, the abscissa z represents the direction of thickness of tunnel junction, and simultaneously represents the direction of voltage applied in the tunnel junction element. Herein, the Co layer (1) on the left side of the insulation layer based on aluminum oxide indicates the ferromagnetic material layer initially formed, and the Co layer (2) on the right side indicates the ferromagnetic material layer formed after the oxidation of the Al film.

In this way, by selecting, as an insulator material, a material which forms a solid solution together with a material used in a ferromagnetic material layer in contact with it, a solid solution of both materials can be formed in the vicinity of the interface between the insulation material layer and one of the ferromagnetic material layers and, accordingly, it is possible that the materials of the layers on either side in contact with the insulation layer are different from each other. Such a solid solution can be formed in only one of the magnetic layers in contact with the insulation layer as described above by, for instance, forming an insulation material layer from a non-magnetic metal which forms a solid solution together with Co, Fe, Ni, and an alloy of these metals, which are ferromagnetic materials, subsequently oxidizing the vicinity of its surface by natural oxidation or plasma oxidation to yield an underlying portion of poor oxidation, and then carrying out heat treatment.

Figure 15:
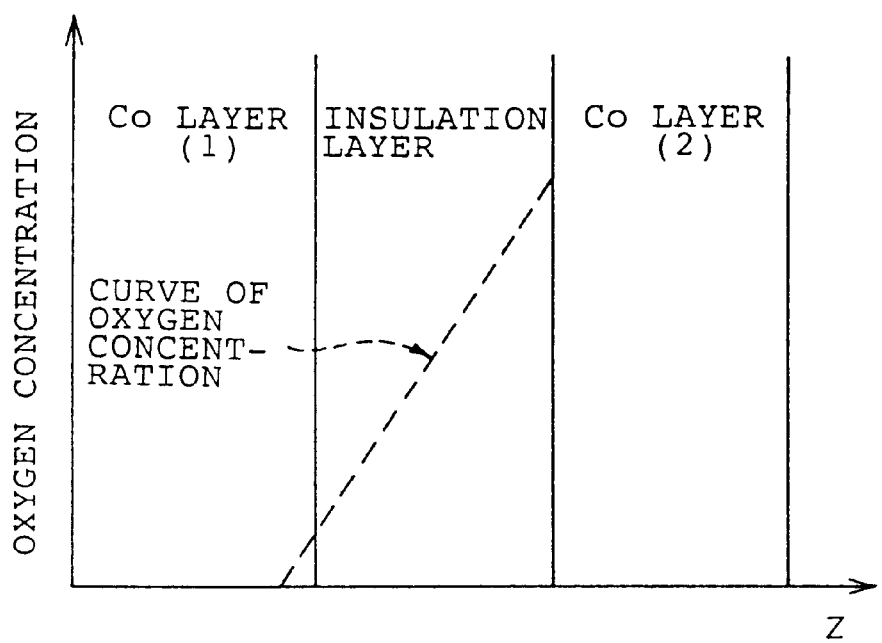
FIG. 15 is a schematic diagram illustrating an oxygen distribution in a tunnel insulation layer.

By way of another example, a similar effect can be obtained by controlling the distribution of oxygen concentration in an insulation barrier when the insulator material is an oxide such as aluminum oxide. As illustrated in FIG. 15, by forming a barrier layer such that its oxygen concentration is decreased from the surface of a formed Al layer toward the inside, a tunnel junction element having an asymmetric V-R characteristic can be achieved. Although this distribution of oxygen concentration is created to a certain extent by only the oxidation from the surface after the formation of Al film, the distribution of concentration can be created to a greater extent by controlling conditions of oxidization or carrying out a heat treatment. The control of conditions of oxidization can be achieved by, for instance, controlling conditions of plasma oxidization (a power of plasma device, an amount of gas, a treating time and the like). In FIG. 15, the ordinate represents oxygen concentration, and the abscissa z represents the direction of thickness of the tunnel junction and also represents the direction of voltage applied in the element as in FIG. 14.

Next, an example in which a distribution of composition is created in the direction of thickness during the formation of an insulation layer, without a heat treatment, is described.

Figure 16:
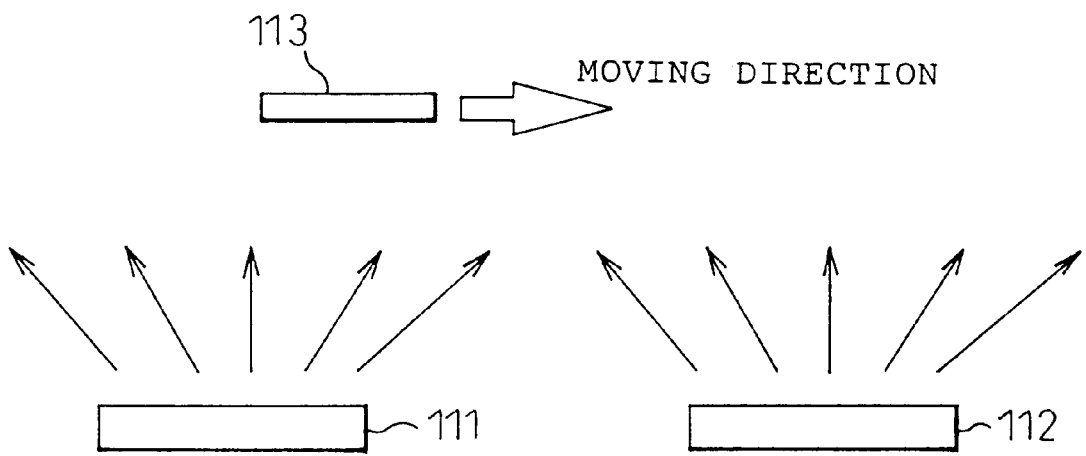
FIG. 16 is a diagram illustrating one of processes for imparting a composition distribution to a tunnel insulation layer.
Figure 17:
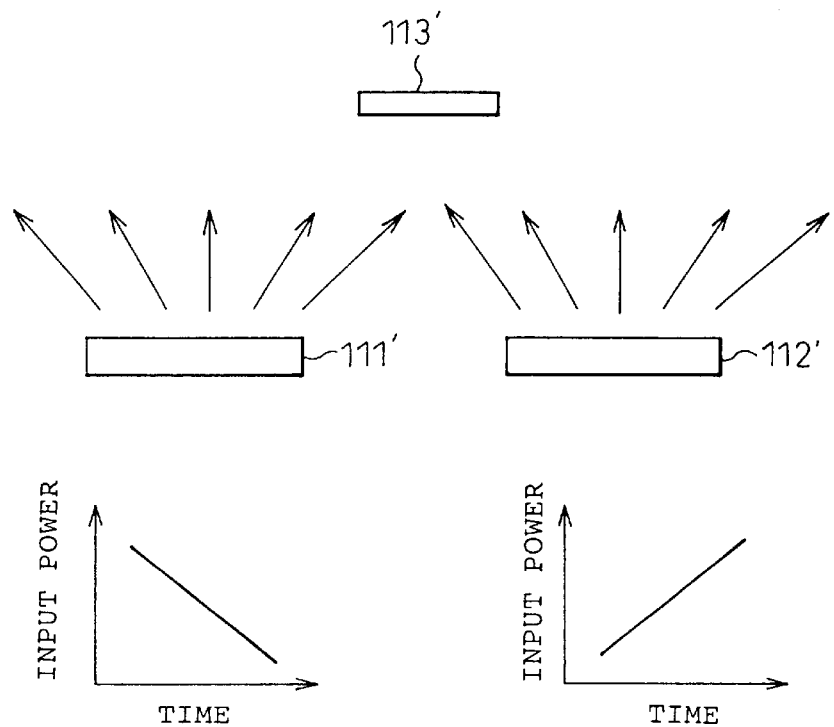
FIG. 17 is a diagram illustrating another process for imparting a composition distribution to a tunnel insulation layer.

For instance, as illustrated in FIG. 16, it is possible to create a distribution of composition in the direction of thickness of an insulation layer formed on a substrate 113 by moving the location of substrate 113 in the moving direction indicated by the rightward arrow while concurrently sputtering two or more targets 111, 112. Also, as illustrated in FIG. 17, a distribution of composition may be created in a formed insulation layer in the direction of its thickness by changing the ratio of the electric powers input to two or more targets 111', 112' with time, as illustrated in the graph at the lower portion of the drawing, to thereby control frequencies of coming elements from the respective targets to a substrate 113' on which the insulation layer is formed. It is also possible to form an insulation layer similarly having a distribution of composition in the direction of thickness by, for instance, an evaporation or molecular beam epitaxy process, in addition to the sputtering process illustrated herein.

Figure 18:
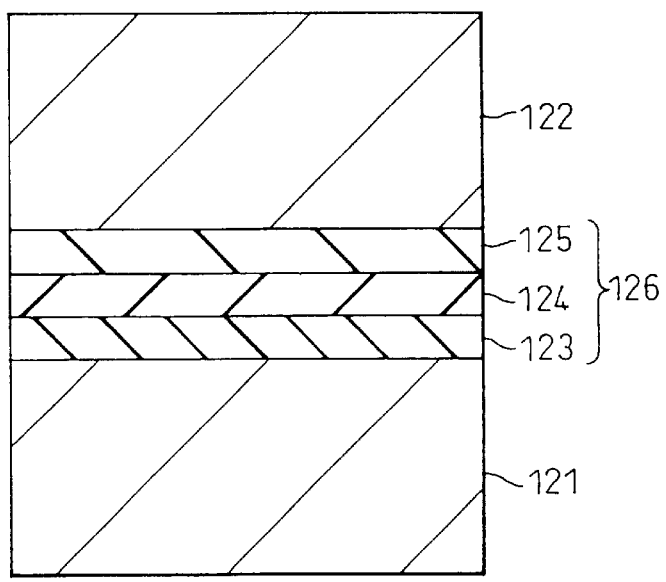
FIG. 18 is an illustration of a ferromagnetic tunnel junction in the invention, having a tunnel insulation layer formed by laminating films having different compositions.

In another example, an insulation layer can be formed by laminating a plurality of films having different compositions or structures. For instance, as illustrated in FIG. 18, it is possible to form an insulation layer 126 by laminating three films 123, 124, and 125 different in composition between ferromagnetic material layers 121 and 122. In this drawing, the laminate of ferromagnetic material layer 121/insulation layer 126/ferromagnetic material layer 122 constitutes the ferromagnetic tunnel junction in the invention.

Figure 19A:
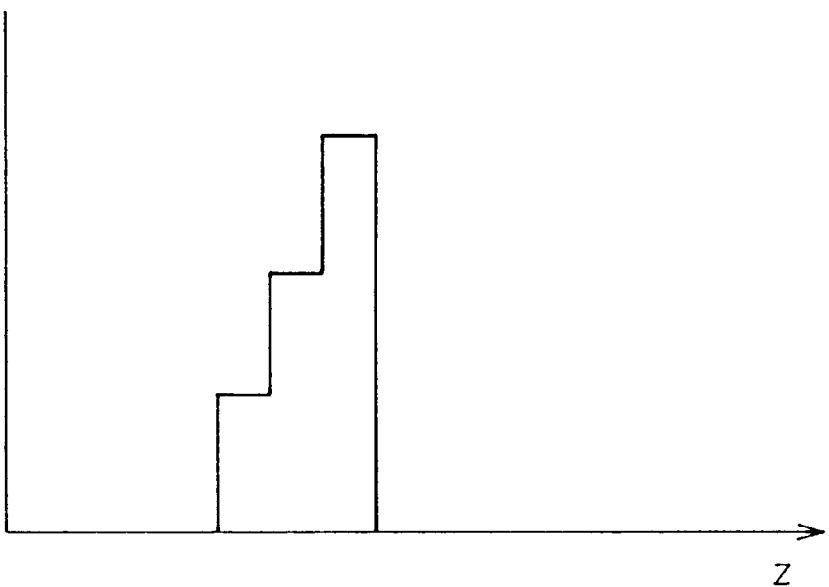
FIGS. 19A and 19B are diagrams illustrating concentration distributions in the insulation layer of the ferromagnetic tunnel junction element of the second embodiment of the invention.
Figure 19B:
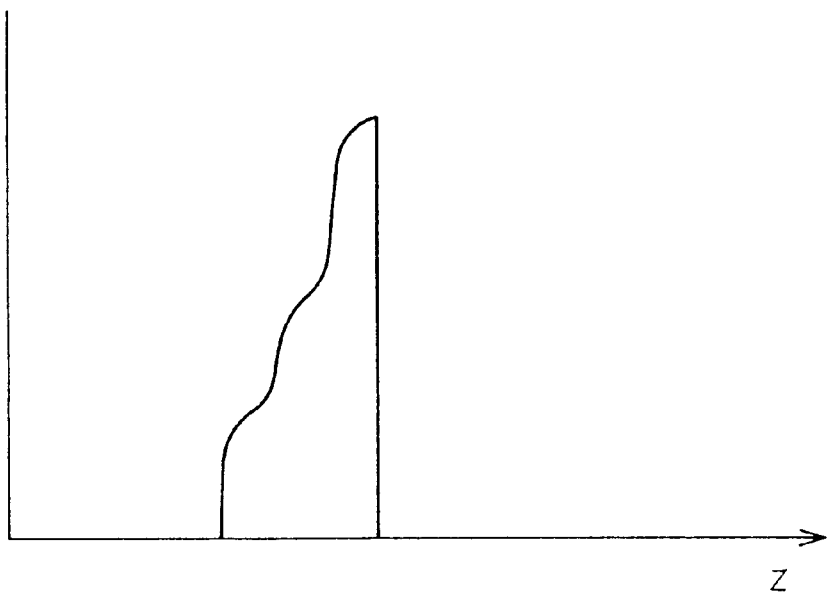

The insulation layer 126 thus formed by laminating films 123, 124, 125 different in composition does not have a continuous distribution along the z axis representing the direction of voltage applied in the insulation layer (tunnel barrier layer), as illustrated in FIG. 19A, with respect to a concentration of a certain component (by way of example, oxygen in an insulation layer of aluminum oxide). However, since the distribution of concentration is asymmetric, the V-R characteristic in the tunnel junction element is also asymmetric, and an effect on reducing the dependency of the resistance value of an element on the voltage can be obtained. It is also possible to alter a step-like curve of concentration distribution of a certain component in the laminated insulation layer 126, as in FIG. 19A, into one close to a continuous curve as in FIG. 19B, by heat-treating the insulation layer 126 formed by laminating the three films in FIG. 18.

Figure 20:
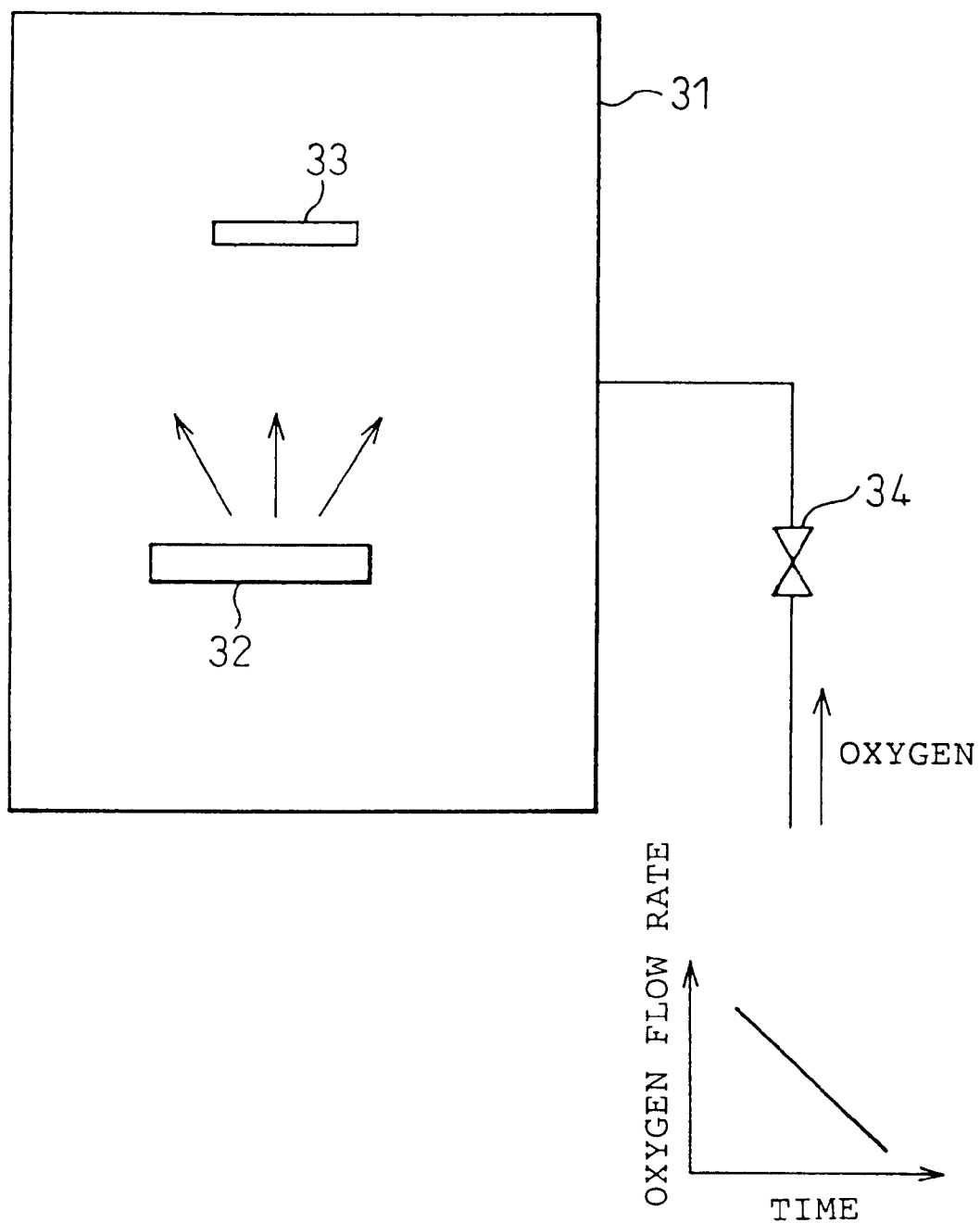
FIG. 20 is a diagram illustrating a further process for imparting a composition distribution to a tunnel insulation layer.

A still further example in which a composition distribution is formed in an insulation layer in the direction of its thickness will be described. In this example, a film of metal such as Al is formed in an atmosphere containing oxygen, for instance, during the formation of an insulation layer of an oxide. As shown in FIG. 20, when the insulation layer (not shown) is formed on a substrate 133 by a sputtering process using an Al target 132 in a chamber 131, an oxygen distribution within an insulation layer can be adjusted by feeding oxygen into the chamber 131 to form a film while oxidizing Al, and controlling the amount of fed oxygen by a flow controlling unit 134 with time, as illustrated in the graph at the lower portion of the drawing, to thereby result in an element provided with a asymmetric V-R characteristic.

As earlier described, in the invention, a fetromagnetic tunnel junction element having an asymmetric V-R characteristic can be made by various methods. The ferromagnetic tunnel junction element of this embodiment of the invention has a junction structure in which the insulation layer 128 is positioned between the ferromagnetic material layers 121 and 122, as schematically illustrated in FIG. 18. Although the insulation layer 126 in FIG. 18 is made up by laminating the films 123, 124, 125 of insulation materials which are different in composition, it is, of course, evident from the above description that the insulation layer 126 in the invention can be formed by forming a film from one material, and changing the composition thereof in the direction of voltage applied.

Furthermore, in addition to the laminated structure of ferromagnetic material/insulator/ferromagnetic material constituting a tunnel junction, the ferromagnetic tunnel junction element of the invention can also comprise a layer or layers of other material or materials as illustrated before.

A ferromagnetic tunnel junction element of the invention provided with an asymmetric V-R characteristic with respect to the direction of voltage applied, and having reduced dependencies of resistance value and rate of change in resistance on voltage accordingly, can be preferably used in a magnetic sensor comprising a supporting substrate, a ferromagnetic tunnel junction element, and an element converting a change in magnetic field to change in resistance, as is the ferromagnetic tunnel junction element of the embodiment of the invention earlier described. Accordingly, the magnetic sensor of this embodiment comprises:

(a) a supporting substrate,
(b) a ferromagnetic tunnel junction element comprising a tunnel junction of laminated structure of ferromagnetic material/insulator/ferromagnetic material formed on the supporting substrate, with the tunnel junction having a voltage-resistance characteristic which is asymmetric in the direction of voltage applied, and
(c) a converter element converting change in magnetic field to change in resistance.

This magnetic sensor in the invention can be widely used as a magnetic sensor for sensing a magnetic field, or in a magnetic head used for reading high-density magnetic recording and the like.

In the invention, an embodiment comprising two or more tunnel junctions of structured ferromagnetic material/insulator/magnetic material having an asymmetric V-R characteristic relative to the direction of voltage applied is also feasible, and, by further easing dependencies of resistance value and rate of change in resistance on voltage using such a construction, it is also possible to achieve a ferromagnetic tunnel junction element having a smaller change in resistance.

As an example of an element comprising such a plurality of tunnel junctions, an element having a laminated structure of magnetic layer (1)/insulation layer (1)/magnetic layer (2)/insulation layer (2)/magnetic layer (3) can be referred to. In this case, a tunnel junction is made up of magnetic layer (1)/insulation layer (1)/magnetic layer (2), and another tunnel junction is made up of magnetic layer (2)/insulation layer (2)/magnetic layer (3). These two tunnel junctions are combined in such a manner that dependencies of their resistance on voltage are symmetric to each other, to thereby allow dependencies of resistance value and rate of change in resistance on voltage as the entire element to be eased. In the element of this structure, the directions of magnetization of the two outside magnetic layers (1) and (3) are fixed.

In addition, in the above element comprising two tunnel junctions, the direction of magnetization of the magnetic layer (2) may be affected due to magnetic fields generated from the ends of the magnetic layers (1) and (3); to avoid this, each of the magnetic layers (1) and (3) can have a three-layer structure of ferromagnetic layer (a)/non-magnetic layer (b)/ferromagnetic layer (c). In this case, the ferromagnetic layers (a) and (c) are anti-ferromagnetically coupled through the non-magnetic layer (b).

Figure 21:
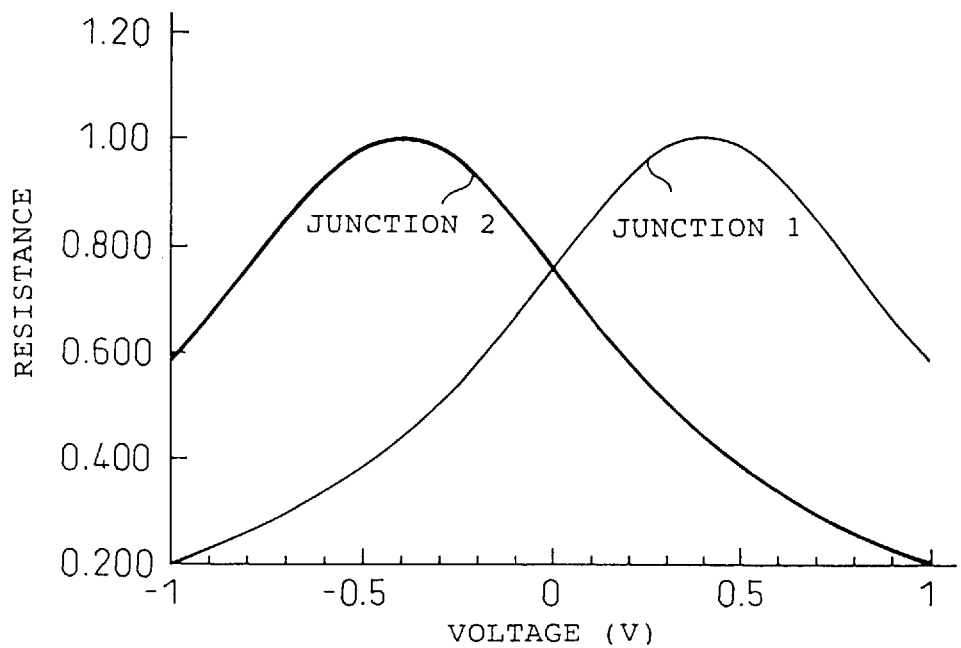
FIG. 21 is a graph showing asymmetric voltage-resistance (V-R) characteristic of two junctions, which are connected in series and are used to form a ferromagnetic tunnel junction element of the invention.

Next, an embodiment comprising such a plurality of tunnel junctions is specifically described. In such an embodiment, a tunnel junction 1 having a V-R curve in which the point at which the resistance value is maximum is shifted toward the positive voltage side, as shown in FIG. 21, and a tunnel junction 2 having a curve in which the point at which the resistance value is maximum is shifted toward the negative voltage side, are connected in series to form an element.

Figure 1:
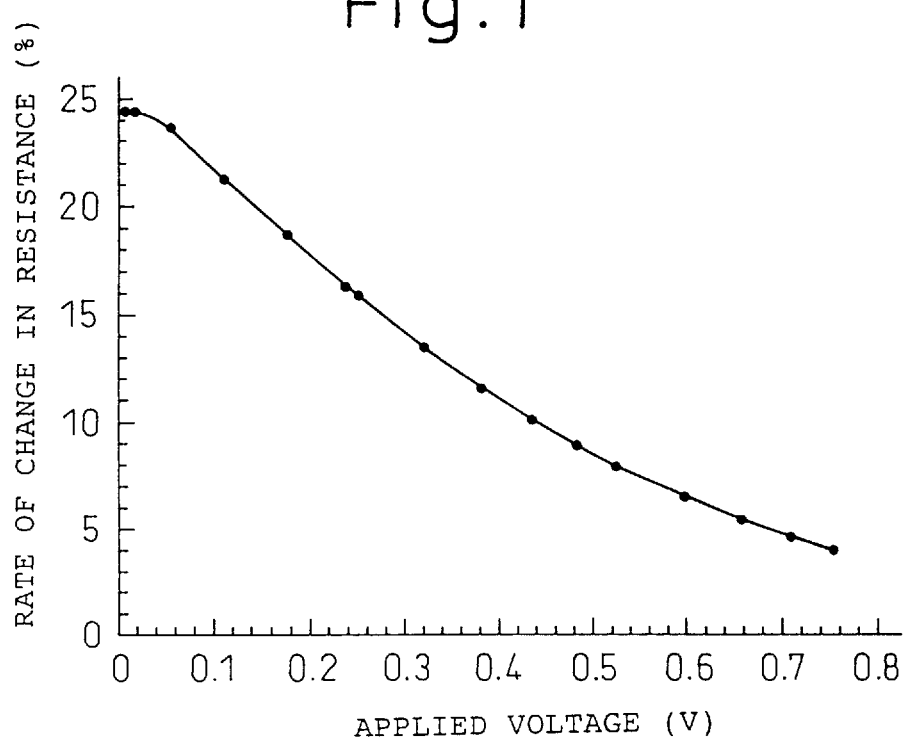
FIG. 1 is a graph of representative measurements showing the dependency of the rate of change in resistance in a ferromagnetic tunnel junction on the voltage applied.
Figure 2:
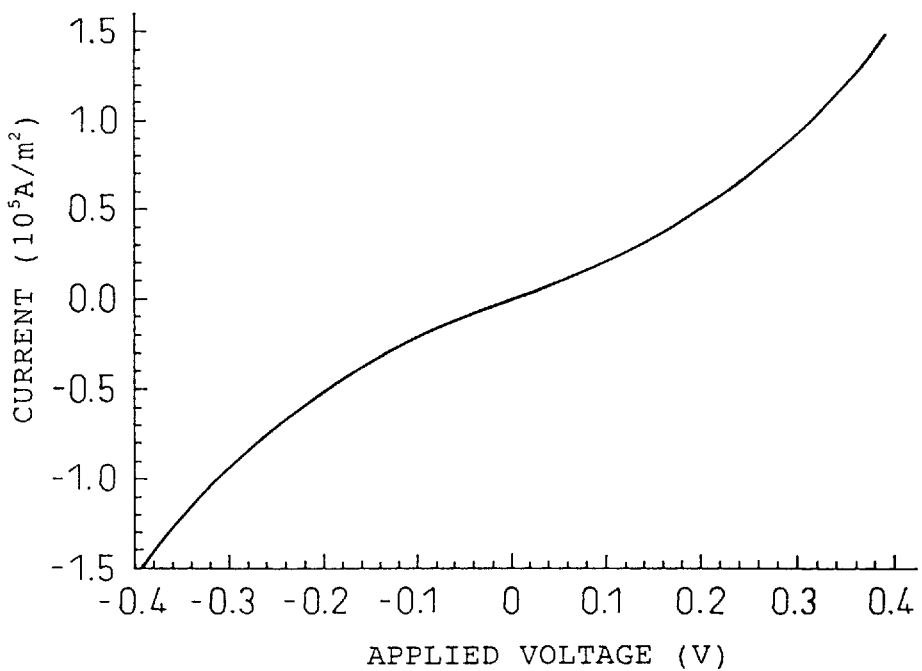
FIG. 2 is a graph showing a representative voltage-current (V-I) characteristic of a ferromagnetic tunnel junction.
Figure 3:
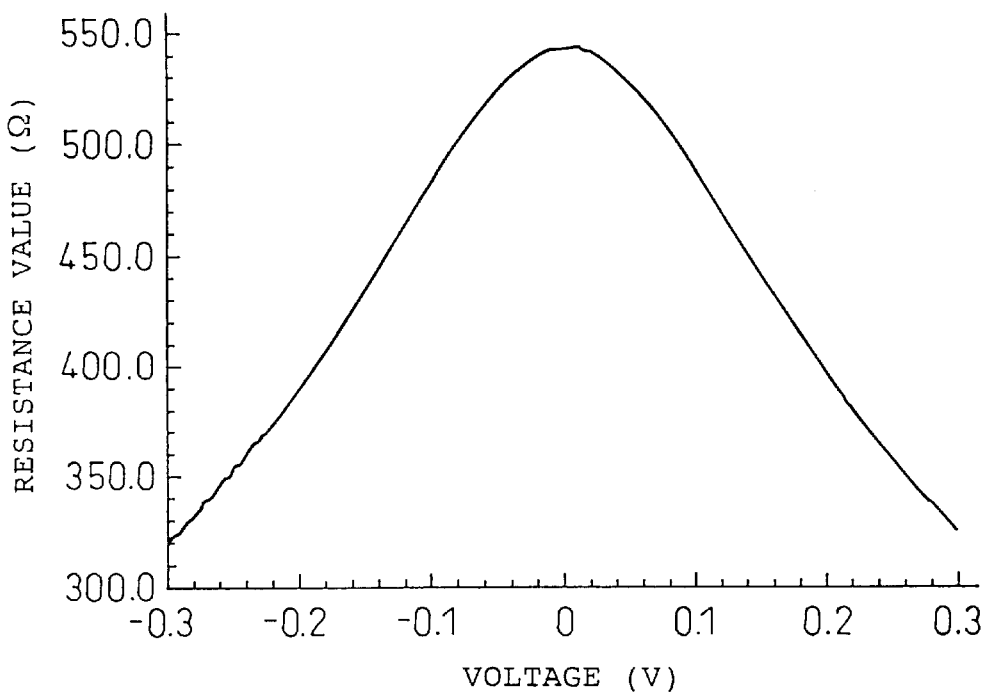
FIG. 3 is a graph showing a representative voltage-resistance (V-R) characteristic of a ferromagnetic tunnel junction.
Figure 22:
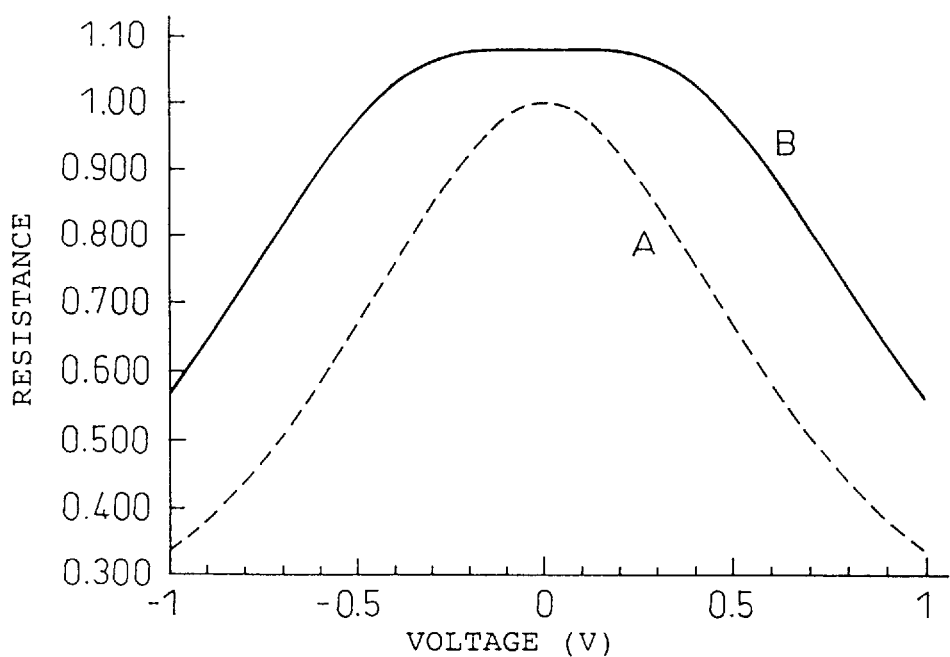
FIG. 22 is a graph showing voltage-resistance (V-R) characteristic for combined resistance of a ferromagnetic tunnel junction element according to the invention formed by connecting in series two junctions having asymmetric voltage-resistance (V-R) characteristic, compared with V-R characteristic of a conventional tunnel junction element.

A combined V-R characteristic of ferromagnetic tunnel junction elements of this structure is shown in FIG. 22, in comparison with a V-R characteristic of a conventional tunnel junction element in which the point at which the resistance value is maximum is not shifted from the line of voltage applied of 0 V. In this drawing, the curve A indicated by broken lines shows a non-shifted V-R characteristic of a conventional tunnel junction element as illustrated before referring to FIG. 3, and the curve B indicated by a solid line shows a combined VR characteristic of a ferromagnetic tunnel junction element of the invention formed by connecting the above junctions 1 and 2 in series. In the tunnel junction element of the invention, effects in the direction of resistance R of the junction 1 being increased and decreased for an applied voltage and those of junction 2 also being increased and decreased for an applied voltage cancel each other and, accordingly, the dependency of resistance on voltage is restricted to a small value in a wide range of voltage in comparison to the conventional tunnel junction element.

Also in the ferromagnetic tunnel junction element of the invention having two junctions connected in series so as to show counterpolarity, a voltage is distributed to the respective junctions because of the series connection and, accordingly, the dependency of rate of change in resistance on voltage is improved and is ½ of that of the two elements before their combination by connecting them. Similarly, in the case where two o junctions are connected in parallel, change in combined resistance is also restrained, since the two types of junctions have respective resistances which are changed in the opposite direction.

Figure 23:
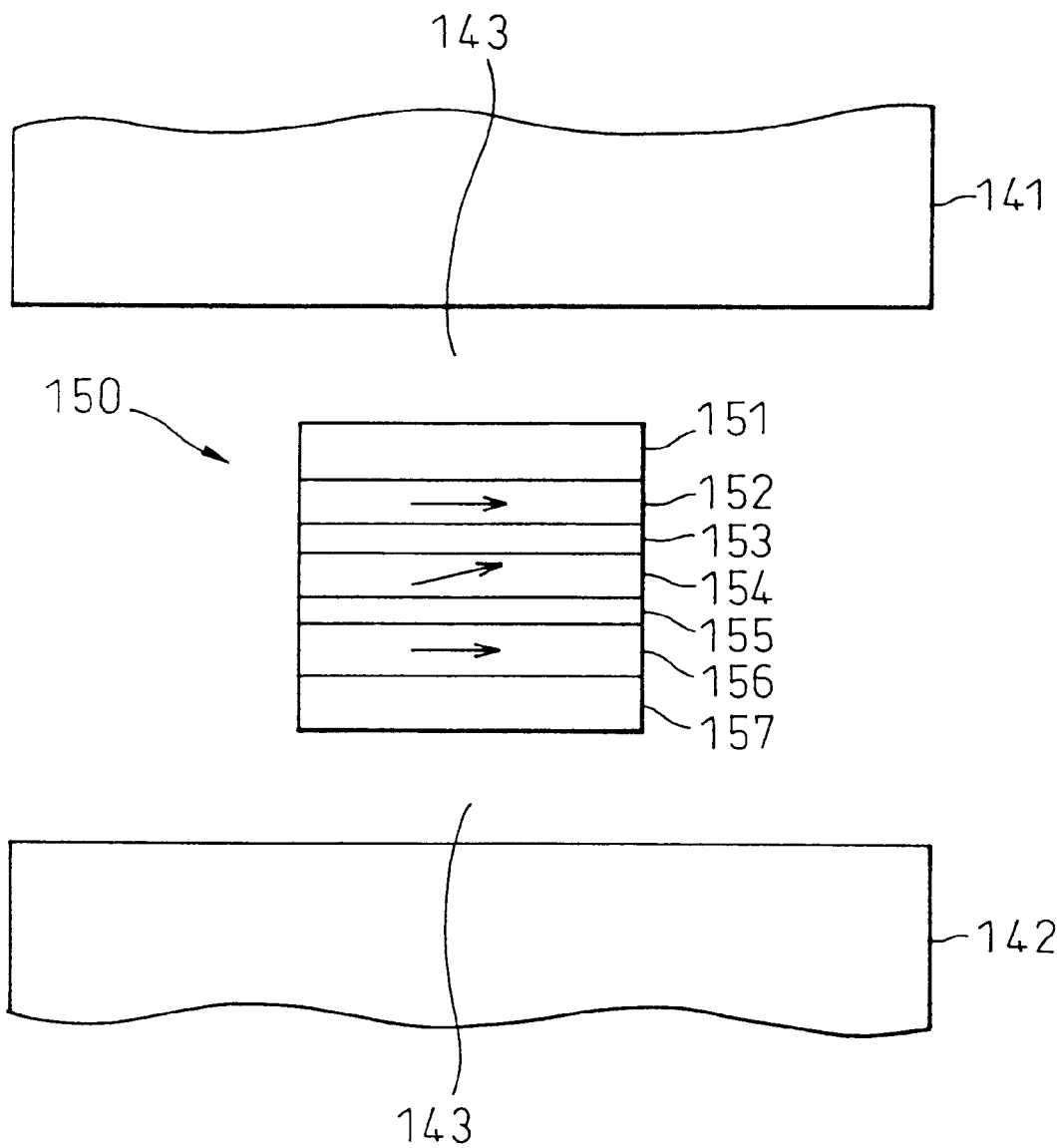
FIG. 23 is an illustration of a representative magnetic head using a ferromagnetic tunnel junction element of the invention, which comprises two junctions having asymmetric V-R characteristic and connected in series so as to show polarities reverse to each other.

In FIG. 23, a head for reading a magnetic recording is schematically shown, the head using a ferromagnetic tunnel junction element 150 of the invention comprising two junctions which have an asymmetric V-R characteristic and are connected in series to show counterpolarity. The face shown in the drawing is a face of the magnetic head described herein which is opposite to a magnetic recording medium. In general, in such a reading head, an element 150 for sensing a magnetic field is inserted in a reading gap 143 between an upper shield 141 and a lower shield 142. In an example described herein, this element 150 is a ferromagnetic tunnel junction element of the invention, the element 150 having a laminated structure of anti-ferromagnetic layer 151/magnetic layer 152/insulation layer 153/magnetic layer 154/insulation layer 155/magnetic layer 156/anti-ferromagnetic layer 157. This laminated structure can also comprise a supporting substrate (not shown) used to successively form the layers 151 to 157. Arrows indicated in the magnetic layers 152, 154, 156 shows the directions of magnetization in the respective layers, and the direction of magnetization in the magnetic layers 152 and 156 are fixed.

Although the magnetic layers 152 and 156 may be any kind of material as long as the material is a ferromagnetic material based on Fe, Co, Ni, or an alloy of these metals, a metal material having a high polarizability is preferred since it provides a large rate of change in resistance. As an example of such metals having a high polarrizability, a Co—Fe alloy can be referred to. For the anti-ferromagnetic layers 151, 157, a material which induces unidirectional anisotropy in metal materials of the magnetic layer 152, 156 is used, such as FeMn, IrMn, PdPtMn, NiO, and RhMn. The intermediate magnetic layer 154 is made of a soft magnetic material having the property of easily changing a direction of magnetization in an external magnetic field. As an example of such a material, an NiFe alloy is referred to. It is not always necessary that the magnetic layers 152, 154, 156 are respectively formed of a film of single layer; the magnetic layers 152 and 156 may be a multi-layer film of two or more ferromagnetic metals which are different in composition, and the magnetic layer 154 may be a multilayer film comprising a layer of soft magnetic material. For instance, the magnetic layers 152 and 156 provide further good element properties by respectively using a material, such as NiFe, which easily induces unidirectional anisotropy in the side in contact with the anti-ferromagnetic layers 151 and 157, and using a material having a large polarizability, such as CoFe, in the side in contact with the insulation layers 153 and 155. The magnetic layer 154 also provides further good elemental properties by using a soft magnetic material such as an NiFe alloy in the middle portion, and a ferromagnetic material having a large polarizability, such as a CoFe alloy, in both sides. Thus, the element 150 used in the magnetic head in this example may be made up of junctions having structures in which the insulation layers 153 and 155 are respectively sandwiched by ferromagnetic layers, or may be made up of junctions having structures in which ferromagnetic layers are used for the external magnetic layers 152 and 156 of the laminated structures comprising the insulation layers 153 and 155, and a soft magnetic layer is used for the intermediate magnetic layer 154.

The insulation layers 153 and 155 are formed in such a manner that the points in their V-R curves at which the resistance value is maximum are shifted toward the opposite voltage sides. That is to say, a first tunnel junction made up of magnetic layer 152/insulation layer 153/magnetic layer 154 and a second tunnel junction made up of magnetic layer 154/insulation-layer 155/magnetic layer 156 are formed so as to have dependencies of resistance on voltage which are asymmetric each other.

In the case where an element used in a magnetic head has a laminated structure as shown in FIG. 23, particularly when the reading gap 143 has a reduced width, the direction of magnetization of the intermediate magnetic layer 154 is affected by the magnetic fields generated from the ends of the outside magnetic layers 152 and 156 and, consequently, a sufficient sensitivity to a magnetic field cannot be obtained. In such a case, a shortage of sensitivity to magnetic field can be compensated for by the portions corresponding to the magnetic layers 152 and 156 of the tunnel junction element 150 in FIG. 23 having a three-layer structure of ferromagnetic layer/non-magnetic layer/ferromagnetic layer.

Figure 24:
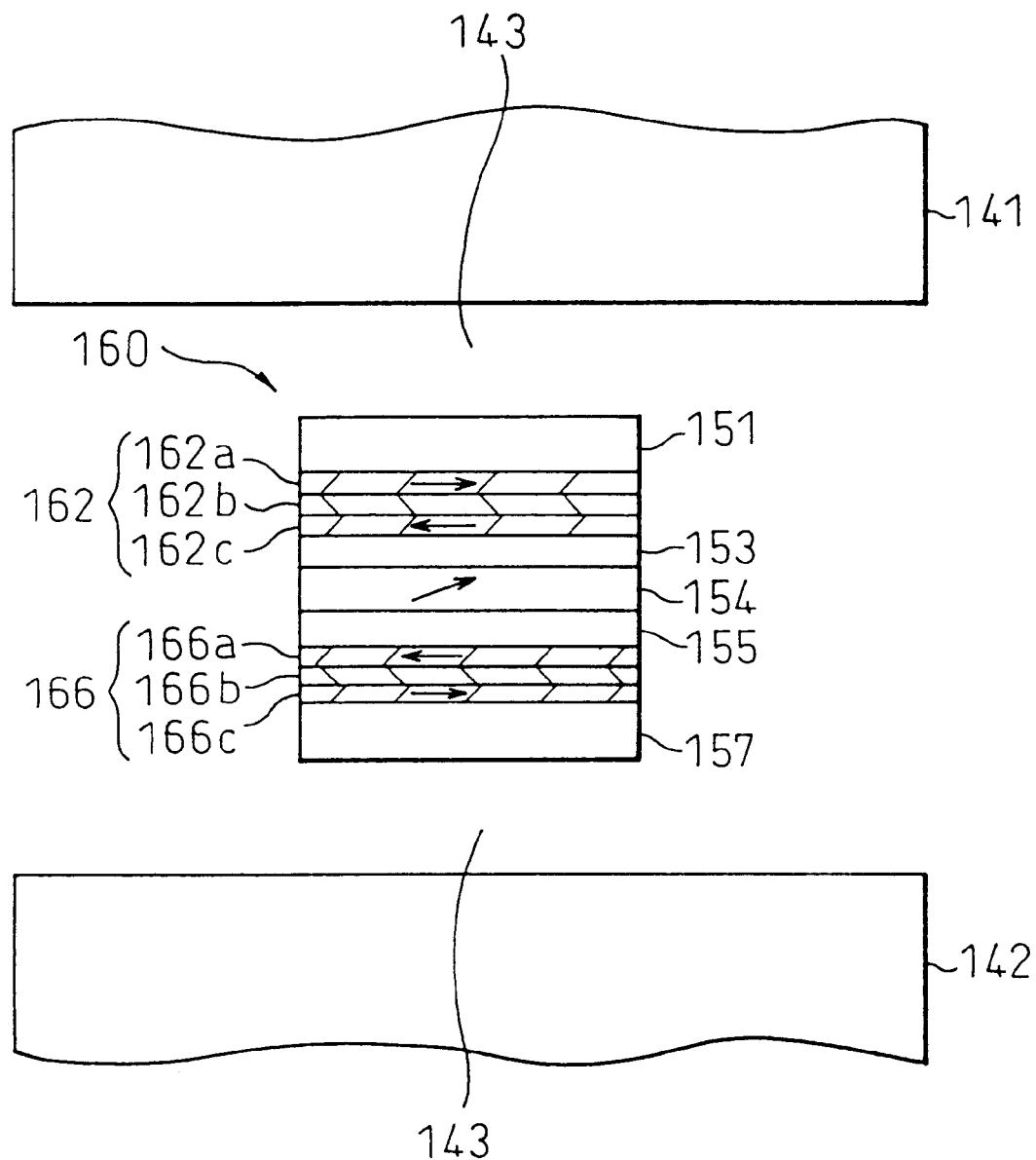
FIG. 24 is an illustration of another representative magnetic head using a ferromagnetic tunnel junction element of the invention.

A magnetic head using a tunnel junction element in which portions corresponding to the outside magnetic layers 152 and 156 in FIG. 23 has such a three-layer structure is schematically illustrated in FIG. 24. In this example, for members which are the same as those used in the magnetic head of FIG. 23, the same reference numbers as used in FIG. 23 are used. As shown in FIG. 24, a ferromagnetic tunnel junction element 160 is used in the magnetic head of this embodiment, the element being similar to that described referring to FIG. 23 except that portion 162 corresponding to the magnetic layer 152 of the element 150 in FIG. 23 has a three-layer structure of ferromagnetic layer 162a/non-magnetic layer 162b/ferromagnetic layer 162c and, similarly, portion 166 corresponding to the magnetic layer 156 has a three-layer structure of ferromagnetic layer 166a/non-magnetic layer 166b/ferromagnetic layer 166c. It is known that in such a three-layer structure of ferromagnetic layer/non-magnetic layer/ferromagnetic layer, by the use of the intermediate non-magnetic layers 162b and 166b having a thickness of the order of 1 nm, the magnetizations of the ferromagnetic layers 162a and 162c on both sides of the layer 162b are anti-ferromagnetically coupled, and the magnetizations of the ferromagnetic layers 166a and 166c on both sides of the layer 166b are anti-ferromagnetically coupled. That is to say, the magnetizations in the magnetic layer 162a (or 166a) and the magnetic layer 162c (166c) are oriented to the opposite directions as indicated by the arrows in FIG. 24. In this way, the magnetic field is closed between the magnetic layers 162a and 162c, or between the magnetic layers 166a and 166c and, consequently, effects on turn of magnetization in the magnetic layer 154 are eliminated.

In this case, a transition metal element, such as Cu or Ru, can be used for the non-magnetic layers 162b and 166b of the tunnel junction element 160. On the other hand, in the respective layers other than the non-magnetic layers 162b and 166b in the element 160, materials similar to those earlier described for the magnetic head shown in FIG. 23 may be used.

In the ferromagnetic tunnel junction elements 150 and 160 used in the magnetic heads illustrated in FIGS. 23 and 24, a resonance tunnel effect (quantum resonance tunnel effect) can occur. Upon the occurrence of a resonance tunnel effect, a wave function of a tunneling electron forms a stationary wave in the interior of the intermediate magnetic layer 154 and, consequently the tunnel probability is changed. By the use of this, a tunnel resistance can be reduced by designing the intermediate magnetic layer 154 to have a thickness resulting in an increased tunnel probability by virtue of a resonance tunnel effect.

As described above, a magnetic head of the invention comprises a ferromagnetic tunnel junction element of the invention comprising a tunnel junction of laminated structure of ferromagnetic material/insulator/ferromagnetic material, the tunnel junction having an asymmetric voltage-resistance characteristic in the direction of the voltage applied, wherein the respective layers of the laminated structure of ferromagnetic material/insulator/ferromagnetic material are positioned in the face of the magnetic head opposite to a magnetic recording medium.

The ferromagnetic tunnel junction element of the invention is also applicable not only to such a magnetic head but also to other devices. For instance, it is applicable to a magnetic sensor in a rotary encoder as earlier mentioned. Alternatively, it may be applicable to a device in which states of magnetization of two layers in a tunnel junction of a ferromagnetic tunnel junction element correspond to states of recording (on/off), and reading is carried out by means of the magnitude of tunnel resistance. Therefore, it would be evident that the invention is not limited to the embodiments and examples particularly described herein, and various changes, modifications and the like are possible.

As describe above, according to the invention, by the use of an Al target material having a particularly high purity of 99.999% or more when an Al film is formed for the formation of a tunnel insulation layer of a ferromagnetic tunnel junction, an MR ratio of the element can be kept relatively high even at a large thickness of tunnel insulation layer. By the tunnel insulation layer thus having a larger thickness, the generation of defects such as pinholes in the tunnel insulation layer can be prevented before their generation, to thereby improve the reliability of a ferromagnetic tunnel junction element, and the reduction in yield in the production of ferromagnetic tunnel junction elements can be prevented.

Also, according to the invention, the use of a ferromagnetic tunnel junction element having a reduced dependencies of resistance value and rate of change in resistance on voltage, and a magnetic sensor using the element, is made possible.

From the above description, features of the invention are enumerated as follows, by way of example.

1. A magnetic sensor which comprises:
   (1) a supporting substrate,
   (2) a ferromagnetic tunnel junction element which has a first magnetic layer on the supporting substrate, a tunnel insulation layer on the first magnetic layer, the tunnel insulation layer comprising aluminum oxide obtained by oxidizing an aluminum film formed on the first magnetic layer by sputtering using an aluminum target having a purity of 99.999% or more, and a second magnetic layer on the tunnel insulation layer, and
   (3) a converter element converting change in magnetic field to change in resistance.

2. The magnetic sensor described in item 1 above, wherein the first magnetic layer is formed of a two-layer film consisting of an NiFe layer and a Co layer, and the Co layer is in contact with the insulation layer.

3. The magnetic sensor described in item 1 or 2 above, wherein the second magnetic layer is formed of a multi-layer film in which a Co layer, an NiFe layer, an FeMn layer, and an NiFe layer are successively formed, and the Co layer is in contact with the insulation layer.

4. The magnetic sensor described any one of items 1 to 3 above, wherein the direction of magnetization in one magnetic layer of the first and second magnetic layers is freely changed by an external magnetic field, and the direction of magnetization in the other magnetic layer is fixed without being affected by an external magnetic field when the external magnetic field is smaller than a certain value.

5. A method of producing a magnetic sensor comprising (1) a supporting substrate, (2) a ferromagnetic tunnel junction element having a first magnetic layer on the supporting substrate, a tunnel insulation layer on the first magnetic layer, and a second magnetic layer on the tunnel insulation layer, and (3) a converter element converting a change in magnetic field to a change in resistance, wherein the ferromagnetic tunnel junction element is fabricated by a process including the steps of: forming the first magnetic layer on the supporting substrate, sputtering an aluminum target having a purity of 99.999% or more to form an aluminum film on the first magnetic layer, oxidizing the aluminum film to convert it into the tunnel insulation layer comprising aluminum oxide, and forming the second magnetic layer on the tunnel insulation layer.

6. The method described in item 5 above, wherein a pressure of an atmosphere before the sputtering of the aluminum target is not greater than $2 \times 10^{-4}$ Pa.

7. The method described in item 5 or 6 above, wherein the aluminum film formed on the first magnetic layer has a thickness of 1.7 to 3.5 nanometers.

8. The method described in any one of items 5 to 7 above, wherein the aluminum film on the first magnetic layer is oxidized in an oxygen plasma to be converted into the tunnel insulation layer comprising aluminum oxide.

9. A magnetic head which comprises the magnetic sensor described in any one of items 1 to 4 above.

10. The magnetic head described in item 9 above, wherein a face of the magnetic head opposite to a magnetic recording medium includes the supporting substrate, and the ferromagnetic tunnel junction element having the first magnetic layer, the tunnel insulation layer, and the second magnetic layer successively formed on the supporting substrate.

11. A ferromagnetic tunnel junction element which comprises a tunnel junction of laminated structure of ferromagnetic material/insulator/ferromagnetic material, and the tunnel junction has a voltage-resistance characteristic which is asymmetric in the direction of voltage applied.

12. The ferromagnetic tunnel junction element described in item 11 above, wherein a material is used in a layer of the insulator, the material having a composition distribution which is asymmetric relative to the direction of voltage applied to the element.

13. The ferromagnetic tunnel junction element described in item 12 above, wherein the insulator is an oxide, and oxygen concentration of the oxide is asymmetric relative to the direction of voltage applied to the element.

14. The ferromagnetic tunnel junction element described in item 11 above, wherein materials for both layers in contact with a layer of the insulator are different from each other.

15. The ferromagnetic tunnel junction element described in item 14 above, wherein the presence of a solid solution of a component of the insulator and the ferromagnetic material in the boundary region between the layer of the insulator and one layer of ferromagnetic material in contact with the insulator layer makes the materials for both layers in contact with the layer of the insulator different from each other.

16. The ferromagnetic tunnel junction element described in any one of items 11 to 15 above, which comprises a plurality of tunnel junctions, and is constructed by connecting these junctions in series in such a manner that their changes in resistance relative to the increase in voltage are oriented in the opposite directions.

17. The ferromagnetic tunnel junction element described in any one of items 11 to 15 above, which comprises a plurality of tunnel junctions, and is constructed by connecting these junctions in parallel in such a manner that their changes in resistance relative to the increase in voltage are oriented in the opposite directions.

18. The ferromagnetic tunnel junction element described in item 16 above, which has a laminated structure of magnetic layer (1)/insulation layer (1)/magnetic layer (2)/insulation layer (2)/magnetic layer (3), and wherein a tunnel junction is made up of magnetic layer (1)/insulation layer (1)/magnetic layer (2), and another tunnel junction is made up of magnetic layer (2)/insulation layer (2)/magnetic layer (3), these two tunnel junctions being combined in such a manner that their dependencies of resistance on voltage are symmetric to each other, to thereby enable dependencies of resistance value and rate of change in resistance on voltage of the entire tunnel junction element to be reduced, and wherein the directions of magnetization of the outside magnetic layers (1) and (3) are fixed.

19. The ferromagnetic tunnel junction element described in item 18 above, wherein each of the magnetic layers (1) and (3) have a three-layer structure of ferromagnetic layer (a)/non-magnetic layer (b)/ferromagnetic layer (c), and the ferromagnetic layers (a) and (c) are anti-ferromagnetically coupled through the non-magnetic layer (b).

20. The ferromagnetic tunnel junction element described in item 18 or 19 above, wherein the magnetic layer (2) has a thickness at which a quantum resonance tunnel effect occurs.

21. A magnetic sensor which comprises:
   (a) a supporting substrate,
   (b) a ferromagnetic tunnel junction element comprising a tunnel junction of laminated structure of ferromagnetic material/insulator/ferromagnetic material formed on the supporting substrate, the tunnel junction having a voltage-resistance characteristic which is asymmetric in the direction of voltage applied, and
   (c) a converter element converting a change in magnetic filed to a change in resistance.

22. The magnetic sensor described in item 21 above, wherein a material having a composition distribution which is asymmetric relative to the direction of voltage applied to the element is used in a layer of the insulator.

23. The magnetic sensor described in item 22 above, wherein the insulator is an oxide, and the oxygen concentration of the oxide is asymmetric relative to the direction of voltage applied to the element.

24. The magnetic sensor described in item 21 above, wherein materials for both layers in contact with a layer of the insulator are different from each other.

25. The magnetic sensor described in item 24 above, wherein the materials for both layers in contact with the layer of the insulator are different from each other because of the presence of a solid solution of a component of the insulator and the ferromagnetic material in the boundary region between the layer of the insulator and one layer of the ferromagnetic material in contact with the insulator layer.

26. The magnetic sensor described in any one of items 21 to 25 above, wherein the ferromagnetic tunnel junction element comprises a plurality of tunnel junctions, and the junctions are connected in series in such a manner that their changes in resistance relative to the increase in voltage are oriented in the opposite directions.

27. The magnetic sensor described in any one of items 21 to 25 above, wherein the ferromagnetic tunnel junction element comprises a plurality of tunnel junctions, and the junctions are connected in parallel in such a manner that their changes in resistance relative to the increase in voltage are oriented in the opposite directions.

28. The magnetic sensor described in item 26 above, wherein the ferromagnetic tunnel junction element has a laminated structure of magnetic layer (1)/insulation layer (1)/magnetic layer (2)/insulation layer (2)/magnetic layer (3), and wherein a tunnel junction is made up of magnetic layer (1)/insulation layer (1)/magnetic layer (2), and another tunnel junction is made up of magnetic layer (2)/insulation layer (2)/magnetic layer (3), these two tunnel junctions being combined in such a manner that their dependencies of resistance on voltage are symmetric to each other, to thereby enable dependencies of resistance value and rate of change in resistance on voltage of the tunnel junction element to be reduced, and wherein the directions of magnetization of the outside magnetic layers (1) and (3) are fixed.

29. The magnetic sensor described in item 28 above, wherein each of the magnetic layers (1) and (3) have a three-layer structure of ferromagnetic layer (a)/non-magnetic layer (b)/ferromagnetic layer (c), and the ferromagnetic layers (a) and (c) are anti-ferromagnetically coupled through the non-magnetic layer (b).

30. The magnetic sensor described in item 28 or 29 above, wherein the magnetic layer (2) has a thickness at which quantum resonance tunnel effect occurs.

31. A magnetic head which comprises the magnetic sensor described in any one of items 21 to 30 above.

32. The magnetic head described in item 31 above, wherein respective layers of the laminated structure of ferromagnetic material/insulator/ferromagnetic material are positioned in a face of the magnetic head opposite to a magnetic recording medium.

33. A method of producing a ferromagnetic tunnel junction element comprising a tunnel junction of laminated structure of ferromagnetic material/insulator/ferromagnetic material, the method comprising imparting, to the tunnel junction, voltage-resistance characteristic which is asymmetric in the direction of voltage applied thereto.

34. The method described in item 33 above, wherein the asymmetric voltage-resistance characteristic is imparted to the tunnel junction by a treatment including the steps of:

(1) depositing and forming a film of non-magnetic material on the surface of a layer of a first ferromagnetic material, the non-magnetic material being a material for the insulator and being capable of forming a solid solution together with the first ferromagnetic material, (2) causing oxygen to act on the film of non-magnetic material from its surface to thereby oxidize the film at a region of the surface to convert it into an insulator, (3) depositing and forming a layer of a second ferromagnetic material on the oxidized surface of the film of non-magnetic material, and (4) forming a solid solution of the first ferromagnetic material and the non-magnetic material under the region converted to the insulator in step (2), by heat treatment.

35. The method described in item 33 above, wherein the insulator is an oxide, and wherein a layer of the insulator is formed in an oxygen atmosphere, and a partial pressure of oxygen in the atmosphere during the formation of the layer is changed with time.

36. The method described in item 33 above, wherein a tunnel junction is formed using, as the insulator, a material having a composition distribution which is asymmetric relative to the direction of voltage applied to the element, or a tunnel junction is formed using, as the insulators, different materials in layers in contact with a layer of the insulator on both sides thereof, and the junction is subjected to a heat treatment.

37. The method described in item 33 above, wherein a tunnel junction is formed, the tunnel junction comprising, as the insulator, an oxide in which concentration of oxygen is asymmetric relative to the direction of voltage applied to the element, and the junction is subjected to a heat treatment.

What is claimed is:

1. A magnetic sensor which comprises:

(1) a supporting substrate, (2) a ferromagnetic tunnel junction element which has a first magnetic layer on the supporting substrate, a tunnel insulation layer on the first magnetic layer, the tunnel insulation layer comprising aluminum oxide obtained by oxidizing an aluminum film formed on the first magnetic layer by sputtering using an aluminum target having a purity of 99.999% or more, and a second magnetic layer on the tunnel insulation layer, and (3) a converter element converting a change in magnetic field to a change in resistance, and wherein the first magnetic layer is formed of a two-layer film consisting of an NiFe layer and a Co layer, and the Co layer is in contact with the insulation layer.

2. The magnetic sensor of claim 1, wherein the second magnetic layer is formed of a multi-layer film in which a Co layer, an NiFe layer, an FeMn layer, and an NiFe layer are successively formed, and the Co layer is in contact with the insulation layer.

3. The magnetic sensor of claim 1, wherein the direction of magnetization in one magnetic layer of the first and second magnetic layers is freely changed by an external magnetic field, and the direction of magnetization in the other magnetic layer is fixed without being affected by an external magnetic field when the external magnetic field is smaller than a certain value.

4. A magnetic head which comprises:
a magnetic sensor which comprises:
(1) a supporting substrate,
(2) a ferromagnetic tunnel junction element which has a first magnetic layer on the supporting substrate, a tunnel insulation layer on the first magnetic layer, the tunnel insulation layer comprising aluminum oxide obtained by oxidizing an aluminum film formed on the first magnetic layer by sputtering using an aluminum target having a purity of 99.999% or more, and a second magnetic layer on the tunnel insulation layer, and
(3) a converter element converting a change in magnetic field to a change in resistance, and
wherein the first magnetic layer is formed of a two-layer film consisting of an NiFe layer and a Co layer, and the Co layer is in contact with the insulation layer.

5. The magnetic head of claim 4, wherein a face of the magnetic head opposite to a magnetic recording medium includes the supporting substrate, and the ferromagnetic tunnel junction element having the first magnetic layer, the tunnel insulation layer, and the second magnetic layer successively formed on the supporting substrate.

6. A ferromagnetic tunnel junction element which comprises a tunnel junction of laminated structure of ferromagnetic material/insulator/ferromagnetic material, and the tunnel junction has a voltage-resistance characteristic which is asymmetric in the direction of voltage applied,
wherein a material is used in a layer of the insulator, the material having a composition distribution which is asymmetric relative to the direction of voltage applied to the element.

7. The ferromagnetic tunnel junction element of claim 6, wherein the insulator is an oxide, and the oxygen concentration of the oxide is asymmetric relative to the direction of voltage applied to the element.

8. A ferromagnetic tunnel junction element which comprises a tunnel junction of laminated structure of ferromagnetic material/insulator/ferromagnetic material, and the tunnel junction has a voltage-resistance characteristic which is asymmetric in the direction of voltage applied,
wherein the presence of a solid solution of a component of the insulator and the ferromagnetic material in the boundary region between the layer of the insulator and one layer of ferromagnetic material in contact with the insulator layer makes the materials for both layers in contact with the layer of the insulator different from each other.

9. The ferromagnetic tunnel junction element of any one of claim 6, 7 or 8, which comprises a plurality of tunnel junctions, and is constructed by connecting these junctions in series in such a manner that their changes in resistance relative to the increase in voltage are oriented in the opposite directions.

10. The ferromagnetic tunnel junction element of any one of claim 6, 7 or 8, which comprises a plurality of tunnel junctions, and is constructed by connecting these junctions in parallel in such a manner that their changes in resistance relative to the increase in voltage are oriented in the opposite directions.

11. The ferromagnetic tunnel junction element of claim 9, which has a laminated structure of magnetic layer (1)/insulation layer (1)/magnetic layer (2)/insulation layer (2)/magnetic layer (3), and wherein a tunnel junction is made up of magnetic layer (1)/insulation layer (1)/magnetic layer (2), and another tunnel junction is made up of magnetic layer (2)/insulation layer (2)/magnetic layer (3), these two tunnel junctions being combined in such a manner that their dependencies of resistance on voltage are symmetric to each other, to thereby enable dependencies of resistance value and rate of change in resistance on voltage of the entire tunnel junction element to be eased, and wherein the directions of magnetization of the outside magnetic layers (1) and (3) are fixed.

12. The ferromagnetic tunnel junction element of claim 11, wherein each of the magnetic layers (1) and (3) have a three-layer structure of ferromagnetic layer (a)/non-magnetic layer (b)/ferromagnetic layer (c), and the ferromagnetic layers (a) and (c) are anti-ferromagnetically coupled through the non-magnetic layer (b).

13. The ferromagnetic tunnel junction element of claim 11, wherein the magnetic layer (2) has a thickness at which quantum resonance tunnel effect occurs.

14. A magnetic sensor which comprises:
(a) a supporting substrate,
(b) a ferromagnetic tunnel junction element comprising a tunnel junction of laminated structure of ferromagnetic material/insulator/ferromagnetic material formed on the supporting substrate, the tunnel junction having a voltage-resistance characteristic which is asymmetric in the direction of voltage applied, and
(c) a converter element converting a change in magnetic filed to a change in resistance,
wherein a material having a composition distribution which is asymmetric relative to the direction of voltage applied to the element is used in a layer of the insulator.

15. The magnetic sensor of claim 14, wherein the insulator is an oxide, and the oxygen concentration of the oxide is asymmetric relative to the direction of voltage applied to the element.

16. The magnetic sensor of claim 14 or 15, wherein the ferromagnetic tunnel junction element has a laminated structure of magnetic layer (1)/insulation layer (1)/magnetic layer (2)/insulation layer (2)/magnetic layer (3), and wherein a tunnel junction is made up of magnetic layer (1)/insulation layer (1)/magnetic layer (2), and another tunnel junction is made up of magnetic layer (2)/insulation layer (2)/magnetic layer (3), these two tunnel junctions being combined in such a manner that their dependencies of resistance on voltage are symmetric to each other, to thereby enable dependencies of resistance value and rate of change in resistance on voltage of the tunnel junction element to be eased, and wherein the directions of magnetization of the outside magnetic layers (1) and (3) are fixed.

17. The magnetic sensor of claim 16, wherein each of the magnetic layers (1) and (3) have a three-layer structure of ferromagnetic layer (a)/non-magnetic layer (b)/ferromagnetic layer (c), and the ferromagnetic layers (a) and (c) are anti-ferromagnetically coupled through the non-magnetic layer (b).

* * * * *